United States Patent
Oezyilmaz et al.

(10) Patent No.: US 12,431,350 B2
(45) Date of Patent: Sep. 30, 2025

(54) SEED LAYER, A HETEROSTRUCTURE COMPRISING THE SEED LAYER AND A METHOD OF FORMING A LAYER OF MATERIAL USING THE SEED LAYER

(71) Applicant: National University of Singapore, Singapore (SG)

(72) Inventors: Barbaros Oezyilmaz, Singapore (SG); Chee Tat Toh, Singapore (SG); Irfan Haider Abidi, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 17/910,180

(22) PCT Filed: Mar. 9, 2021

(86) PCT No.: PCT/SG2021/050118
§ 371 (c)(1),
(2) Date: Sep. 8, 2022

(87) PCT Pub. No.: WO2021/183050
PCT Pub. Date: Sep. 16, 2021

(65) Prior Publication Data
US 2023/0154747 A1    May 18, 2023

(30) Foreign Application Priority Data
Mar. 10, 2020   (SG) .................... 10202002196X

(51) Int. Cl.
*H01L 21/02* (2006.01)
*C01B 32/05* (2017.01)
(Continued)

(52) U.S. Cl.
CPC ........ *H01L 21/02444* (2013.01); *C01B 32/05* (2017.08); *C23C 16/0272* (2013.01);
(Continued)

(58) Field of Classification Search
CPC ......... H01L 21/02444; H01L 21/02499; H01L 21/0262; H01L 21/02378; H01L 21/02381;
(Continued)

(56) References Cited

U.S. PATENT DOCUMENTS

| 4,725,345 A | 2/1988 | Sakamoto et al. |
| 5,266,409 A | 11/1993 | Schmidt et al. |

(Continued)

FOREIGN PATENT DOCUMENTS

| CA | 2472031 A1 | 8/2003 |
| CN | 1414644 A | 4/2003 |

(Continued)

OTHER PUBLICATIONS

Joo et al., "Realization of continuous Zachariasen carbon monolayer", Science Advances, 3, e1601821, 2017 (Year: 2017).*

(Continued)

*Primary Examiner* — Jay C Kim
*Assistant Examiner* — Woo K Lee
(74) *Attorney, Agent, or Firm* — Botos Churchill IP Law LLP

(57) ABSTRACT

A seed layer for inducing nucleation to form a layer of material is described. In an embodiment, the seed layer comprising a layer of two-dimensional monolayer amorphous material having a disordered atomic structure adapted to create localised electronic states to form electric potential wells for bonding adatoms to a surface of the seed layer via van der Waals interaction to form the layer of material, wherein each of the electric potential wells has a potential energy larger in magnitude than surrounding thermal energy to capture adatoms on the surface of the seed layer. Embodiments in relation to a method for forming the seed layer, a heterostructure comprising the seed layer, a method for (Continued)

forming the heterostructure comprising the seed layer, a device comprising the heterostructure and a method of enhancing vdW interaction between adatoms and a surface of the seed layer are also described.

20 Claims, 11 Drawing Sheets

(51) Int. Cl.
  *C23C 16/02* (2006.01)
  *C23C 16/26* (2006.01)
  *C23C 16/44* (2006.01)
  *C23C 16/48* (2006.01)
(52) U.S. Cl.
  CPC .......... *C23C 16/26* (2013.01); *C23C 16/4418* (2013.01); *C23C 16/483* (2013.01); *H01L 21/02499* (2013.01); *H01L 21/0262* (2013.01); *C01P 2002/02* (2013.01); *C01P 2002/77* (2013.01); *C01P 2002/82* (2013.01); *C01P 2004/04* (2013.01); *C01P 2006/40* (2013.01); *C01P 2006/60* (2013.01); *H01L 21/02378* (2013.01); *H01L 21/02381* (2013.01); *H01L 21/02387* (2013.01); *H01L 21/024* (2013.01); *H01L 21/0242* (2013.01); *H01L 21/02422* (2013.01); *H01L 21/0254* (2013.01); *H01L 21/02543* (2013.01); *H01L 21/02546* (2013.01); *H01L 21/02557* (2013.01); *H01L 21/02562* (2013.01)
(58) Field of Classification Search
  CPC ........... H01L 21/0242; H01L 21/02422; H01L 31/1127; H01L 31/113; H01L 33/002; C01B 32/05; C23C 16/0272; C23C 16/26; C23C 16/4418; C23C 16/483; C01P 2002/02; C01P 2002/77; C01P 2002/82; C01P 2006/40; C01P 2006/60
  See application file for complete search history.

(56) References Cited

U.S. PATENT DOCUMENTS

| | | | |
|---|---|---|---|
| 5,397,644 | A | 3/1995 | Yamashita |
| 5,989,672 | A | 11/1999 | Hayashi |
| 6,599,651 | B1 | 7/2003 | Saitou et al. |
| 8,173,282 | B1 | 5/2012 | Sun et al. |
| 8,569,389 | B2 | 10/2013 | Tsai et al. |
| 8,760,980 | B2 | 6/2014 | Zhang et al. |
| 8,877,340 | B2 | 11/2014 | Chu et al. |
| 8,916,451 | B2 | 12/2014 | Bayram et al. |
| 8,941,950 | B2 | 1/2015 | Yuan et al. |
| 8,999,604 | B2 | 4/2015 | Iseki et al. |
| 9,269,981 | B2 | 2/2016 | Iyuke et al. |
| 9,640,213 | B2 | 5/2017 | Hasegawa et al. |
| 9,792,935 | B2 | 10/2017 | Rejda et al. |
| 10,984,830 | B2 | 4/2021 | Ozyilmaz et al. |
| 11,114,674 | B2 | 9/2021 | Ozyilmaz et al. |
| 11,192,788 | B2 | 12/2021 | Ozyilmaz et al. |
| 2002/0051903 | A1 | 5/2002 | Masuko et al. |
| 2002/0155632 | A1 | 10/2002 | Yamazaki et al. |
| 2003/0082833 | A1 | 5/2003 | Yu et al. |
| 2006/0128079 | A1 | 6/2006 | Tseng et al. |
| 2007/0132375 | A1 | 6/2007 | Bachmann et al. |
| 2009/0017602 | A1 | 1/2009 | Damlencourt et al. |
| 2010/0119725 | A1 | 5/2010 | Brault |
| 2010/0319078 | A1 | 12/2010 | Mcknight et al. |
| 2011/0014548 | A1 | 1/2011 | Blunk et al. |
| 2011/0020727 | A1 | 1/2011 | Burlatsky et al. |
| 2011/0048943 | A1 | 3/2011 | Nemes |
| 2011/0129675 | A1 | 6/2011 | Choi et al. |
| 2011/0151278 | A1 | 6/2011 | Gurney et al. |
| 2011/0290655 | A1 | 12/2011 | Nishikiori et al. |
| 2012/0141799 | A1 | 6/2012 | Kub et al. |
| 2013/0214875 | A1 | 8/2013 | Duncan et al. |
| 2013/0302531 | A1 | 11/2013 | Dadheech et al. |
| 2014/0004445 | A1 | 1/2014 | Tsai et al. |
| 2014/0217356 | A1 | 8/2014 | Bayram et al. |
| 2014/0248513 | A1 | 9/2014 | Takizawa et al. |
| 2014/0356764 | A1 | 12/2014 | Iseki et al. |
| 2015/0009384 | A1 | 1/2015 | Wakano et al. |
| 2015/0093684 | A1 | 4/2015 | Yadav et al. |
| 2016/0036801 | A1 | 2/2016 | Caldwell |
| 2016/0111180 | A1* | 4/2016 | Joo ...................... H10D 30/031 73/31.06 |
| 2017/0032815 | A1 | 2/2017 | Oezyilmaz et al. |
| 2017/0047223 | A1 | 2/2017 | Wang et al. |
| 2017/0186571 | A1 | 6/2017 | Ng et al. |
| 2017/0263966 | A1 | 9/2017 | Lozada et al. |
| 2018/0244524 | A1 | 8/2018 | Ozyilmaz et al. |
| 2018/0323461 | A1 | 11/2018 | Suzuki et al. |
| 2018/0337411 | A1 | 11/2018 | Ozyilmaz et al. |
| 2019/0080713 | A1 | 3/2019 | Ozyilmaz et al. |
| 2019/0088420 | A1 | 3/2019 | Tour et al. |
| 2020/0346934 | A1 | 11/2020 | Thomas et al. |
| 2021/0017026 | A1 | 1/2021 | Ozyilmaz et al. |

FOREIGN PATENT DOCUMENTS

| | | |
|---|---|---|
| CN | 102509694 A | 6/2012 |
| CN | 102576890 A | 7/2012 |
| CN | 104080945 A | 10/2014 |
| CN | 104278241 A | 1/2015 |
| CN | 106061893 A | 10/2016 |
| CN | 107003275 A | 8/2017 |
| CN | 109534315 A | 3/2019 |
| DE | 102009034573 A1 | 2/2010 |
| EP | 2811049 A1 | 12/2014 |
| JP | 1997091686 A | 4/1997 |
| JP | 2002143185 A | 5/2002 |
| JP | 2002312923 A | 10/2002 |
| JP | 2004045144 A | 2/2004 |
| JP | 2005203216 A | 7/2005 |
| JP | 2005523050 A | 8/2005 |
| JP | 2007265916 A | 10/2007 |
| JP | 2008004540 A | 1/2008 |
| JP | 2011142082 A | 7/2011 |
| JP | 2011148686 A | 8/2011 |
| JP | 2014004166 A | 1/2014 |
| JP | 2019010013 A | 1/2019 |
| JP | 2020510590 A | 4/2020 |
| KR | 20020048531 A | 6/2002 |
| KR | 20090012304 A | 2/2009 |
| KR | 101450915 B1 | 10/2014 |
| KR | 20160044977 A | 4/2016 |
| KR | 20170058407 A | 5/2017 |
| KR | 102360025 B1 | 2/2022 |
| WO | 2002009242 B2 | 1/2002 |
| WO | 2003065881 | 8/2003 |
| WO | 2016042309 A1 | 3/2016 |
| WO | 2018156082 A1 | 8/2018 |
| WO | 2020027728 A1 | 2/2020 |
| WO | 2021054900 A1 | 3/2021 |

OTHER PUBLICATIONS

Felix et al., "On the mechanical properties and thermal stability of a recently synthesized monolayer amorphous carbon", Journal of Physical Chemistry C, 124, 14855-14860, 2020 (Year: 2020).*
International Technology Roadmap for Semiconductors—ITRS 2.0 Home Page, available at http://www.itrs2.net/ (last visited Jan. 6, 2023).
Casiraghi, C. et al., "Dynamic Roughening of Tetrahedral Amorphous Carbon," Physical Review Letters, vol. 91, No. 22, pp. 226104-1-226104-4 (2003).
D'Angelo, F. et al., "Micropatterned Hydrogenated Amorphous Carbon Guides Mesenchymal Stem Cells Towards Neuronal Differentiation," European Cells and Materials, vol. 20, pp. 231-244 (2010).

(56) References Cited

OTHER PUBLICATIONS

Kotakoski, J. et al., "From Point Defects in Graphene to Two-Dimensional Amorphous Carbon," Physical Review etters, vol. 106, No. 10 (2021): 105505.
Luo, D. et al., "Influence of Source and Drain Contacts on the Properties of Indium-Gallium-Zinc-Oxide Thin-Film Transistors based on Amorphous Carbon Nanofilm as Barrier Layer," ACS Applied Materials & Interfaces, vol. 7, pp. 3633-3640 (2015).
Suk, J.W. et al., "Mechanical Measurements of Ultra-thin Amorphous Carbon Membranes Using Scanning Atomic Force Microscopy," Carbon, vol. 50, pp. 2220-2225 (2012).
Zheng, G. et al., "Interconnected Hollow Carbon Nanospheres for Stable Lithium Metal Anodes," Nature Nanotechnology, vol. 9, pp. 618-623 (Aug. 2014).
Office Action for Chinese Patent Application No. 202180033843.X, Dec. 18, 2023, 22 Pages.
International Search Report and Written Opinion for International Application No. PCT/SG2021/050118, Date of Mailing: May 28, 2021.
Joo, W.-J. et al., "Realization of Continuous Zachariasen Carbon Monolayer", Science Advances, vol. 3, No. 2, pp. e1601821:1-8 (Feb. 1, 2017).
Li, H.D. et al., "The Van der Waals Epitaxy of Bi2Se3 on the Vicinal Si(111) Surface: an Approach for Preparing High-quality Thin Films of a Topological Insulator", New Journal of Physics, vol. 12, pp. 103038: 1-11 (Oct. 31, 2010).
Toh, C. T. et al., "Synthesis and Properties of Free-standing Monolayer Amorphous Carbon", Nature, vol. 577, pp. 199-203 (Jan. 8, 2020).
Extended European Search Report for European Patent Application No. 21768280.6, dated Apr. 3, 2024, 8 Pages.
Leng, et al., "Mechanical Properties and Platelet Adhesion Behavior of Diamond-Like Carbon Films Synthesized by Pulsed Vacuum Arc Plasma Deposition", Surface Science 531, 177-184 (2003).
Maguire, et al., "Mechanical Stability, Corrosion Performance and Bioresponse of Amorphous Diamond-Like Carbon for Medical Stents and Guidewires", Diamond and Related Materials 14, 1277-1288 (2005).
Marchon, et al., "The Head-Disk Interface Roadmap to an Areal Density of Tbit/in2", Advances in Tribology 2013, 1-8 (2013).
Mattioli, et al., "Nanostructured Polystyrene Films Engineered by Plasma Processes: Surface Characterization and Stem Cell Interaction", Journal of Applied Polymer Science, Wiley Periodicals Inc., 2014, vol. 131, Article 40427, pp. 1-10.
Murry, et al., "Differentiation of Embryonic Stem Cells to Clinically Relevant Populations: Lessons from Embryonic Development", Cell 132, 661-680 (2008).
Pathem, et al., "Carbon Overcoat Oxidation in Heat-Assisted Magnetic Recording", IEEE Transactions on Magentics, vol. 49, No. 7, 2013, pp. 3721-3724.
Ran, et al., "Fabrication and Structure Characterization of Quasi-2-Dimensional Amorphous Carbon Structures", Acta Physico-Chimica Sinica, 2012, vol. 28, No. 7, pp. 1551-1555.
Robertson, "Ultrathin Carbon Coatings for Magnetic Storage Technology", Thin Solid Films, 383, 2001, pp. 81-88.
Schriver, et al., "Graphene as a Long-Term Metal Oxidation Barrier:Worse Than Nothing", ACS Nano 7, 5763-5768 (2013).
Spradling, et al., "Stem Cells Find Their Niche", Nature 414, 98-104 (2001).
Trappman, et al., "Extracellular-Matrix Tethering Regulates Stem-Cell Fate", Nature Materials 11, 642-649 (2012).
Wang, et al., "The Mechanical Performance of DLC Films on Steel Substrates", Thin Solid Films 325, 163-174 (1998).
Zhao, et al., "Synthesis of Large-Scale Undoped and Nitrogen-Doped Amorphous graphene on MgO Substrate by Chemical Vapor Deposition", J. Mater. Chem., 22, pp. 19679-19683; 2012.
The Third Office Action for Chinese Patent Application No. 202180033843.X, Feb. 8, 2025, 7 Pages.
Araujo, et al., "Defects and Impurities in Graphene-Like Materials", Materials Today, vol. 15, No. 3, pp. 98-109, (2012).
Eder, et al., "A Journey from Order to Disorder—Atom by Atom Transformation from Graphene to a 2D Carbon Glass", Scientific Reports, 4:4060, pp. 1-6, (2014).
Gibson, "Solving Amorphous Structures—Two Pairs Beat One", Science, vol. 335, pp. 929-930, (2012).
Gibson, "Substantial Crystalline Topology in Amorphous Silicon", Physical Review Letters, 105, pp. 125504-1-125504-4, (2010).
Gómez-Navarro, et al., "Atomic Structure of Reduced Graphene Oxide", Nano Letters, 10, pp. 1144-1148, (2010).
Gui, et al., "Band Structure Engineering of Graphene by Strain: First-Principles Calculations", Physical Review B, 78, pp. 075435-1-075435-6, (2008).
Herman, "Laser-Assisted Deposition of Thin Films from Gas-Phase and Surface-Adsorbed Molecules", Chem. Rev., 89, pp. 1323-1357, (1989).
Huang, et al., "Direct Imaging of a Two-Dimensional Silica Glass on Graphene", Nano Letters, 12, pp. 1081-1086, (2012).
Jain, et al., "Rupture of Amorphous Graphene via Void Formation", Phys. Chem. Chem. Phys., 20, pp. 16966-16972 (2018).
Jones, et al., "Understanding Disk Carbon Loss Kinetics for Heat Assisted Magnetic Recording", IEEE Transactions on Magnetics, vol. 50, No. 3, 3300704, pp. 1-4, (2014).
Joo, et al., "Realization of Continuous Zachariasen Carbon Monolayer", Sci. Adv., 3:e1601821, pp. 1-8, (2017).
Kim, et al., "Defect-Mediated In-Plane Electrical Conduction in Few-Layer sp2-Hybridized Boron Nitrides", ACS Appl. Mater. Interfaces, 10, pp. 17287-17294, (2018).
Koenig, et al., "Selective Molecular Sieving through Porous Graphene", Nature Nanotechnology, vol. 7, pp. 728-732 (2012).
Koenig, et al., "Ultrastrong Adhesion of Graphene Membranes", Nature Nanotechnology, vol. 6, pp. 543-546, (2011).
Kresse, et al., "Efficient Iterative Schemes for ab Initio Total-Energy Calculations Using a Plane-Wave Basis Set", Phys. Rev. B, vol. 54, No. 16, pp. 11169-11186, (1996).
Lee, et al., "Measurement of the Elastic Properties and Intrinsic Strength of Monolayer Graphene", Science, vol. 321, pp. 385-388, (2008).
Lee, et al., "Stabilization of Graphene Nanopore", PNAS, vol. 111, No. 21, pp. 7522-7526, (2014).
Li, et al., "Large-Area Synthesis of High-Quality and Uniform Graphene Films on Copper Foils", Science, vol. 324, pp. 1312-1314, (2009).
Lichtenstein, et al., "Crystalline-Vitreous Interface in Two Dimensional Silica", Physical Review Letters, 109, pp. 106101-1-106101-5, (2012).
Lichtenstein, et al., "The Atomic Structure of a Metal-Supported Vitreous Thin Silica Film", Angew. Chem. Int. Ed., 51, pp. 404-407, (2012).
Lozada-Hidalgo, et al., "Sieving Hydrogen Isotopes through Two-Dimensional Crystals", Science, vol. 351, Issue 6268, pp. 68-70, (2016).
Mahvash, et al., "Space-Charge Limited Transport in Large-Area Monolayer Hexagonal Boron Nitride", Nano Letters, 15, pp. 2263-2268, (2015).
Nicholl, et al., "The Effect of Intrinsic Crumpling on the Mechanics of Free-Standing Graphene", Nature Communications, 6: 8789, pp. 1-7, (2015).
Perdew, et al., "Generalized Gradient Approximation Made Simple", Phys. Rev. Lett., vol. 77, No. 18, pp. 3865-3868, (1996).
Plimpton, "Fast Parallel Algorithms for Short-Range Molecular Dynamics", Journal of Comput. Phys. vol. 117, pp. 1-19, (1995).
Reiser, et al., "A Reverse-Current Decay Mechanism for Fuel Cells", Electrochemical and Solid-State Letters, 8, pp. A273-A276, (2005).
Ritter, et al., "The Influence of Edge Structure on the Electronic Properties of Graphene Quantum Dots and Nanoribbons", Nature Materials, vol. 8, pp. 235-242, (2009).
Rodin, et al., "Apparent Power-Law Behavior of Conductance in Disordered Quasi-One-Dimensional Systems", Phys. Rev. Lett., 105, pp. 106801-1-106801-4, (2010).
Rodin, et al., "Hopping Transport in Systems of Finite Thickness or Length", Physical Review B, 84, pp. 125447-1-125447-9, (2011).

(56) References Cited

OTHER PUBLICATIONS

Rose, et al., "Complete Characterization by Raman Spectroscopy of the Structural Properties of Thin Hydrogenated Diamond-Like Carbon Films Exposed to Rapid Thermal Annealing", Journal of Applied Physics, 116, pp. 123516-1 to 123516-12, (2014).
Rose, "Space-Charge-Limited Currents in Solids", Physical Review, vol. 97, No. 6, pp. 1538-1544, (1955).
Ruiz-Vargas, et al., "Softened Elastic Response and Unzipping in Chemical Vapor Deposition Graphene Membranes", Nano Letters, 11, pp. 2259-2263, (2011).
Schmittinger, et al., "A Review of the Main Parameters Influencing Long-Term Performance and Durability of PEM Fuel Cells", Journal of Power Sources, 180, pp. 1-14, (2008).
Sharaf, et al., "An Overview of Fuel Cell Technology: Fundamentals and Applications", Renewable and Sustainable Energy Reviews, 32, pp. 810-853, (2014).
Stachurski, "On Structure and Properties of Amorphous Materials", Materials, 4, pp. 1564-1598, (2011).
Stuart, et al., "A Reactive Potential for Hydrocarbons with Intermolecular Interactions", J. Chem. Phys., vol. 112, No. 14, pp. 6472-6486, (2000).
Tauc, "Optical Properties and Electonic Structure of Amorphous Ge and Si", Mat. Res. Bull., vol. 3, pp. 37-46, (1968).
Treacy, et al., "The Local Structure of Amorphous Silicon", Science, vol. 335, pp. 950-953, (2012).
Wright, "Neutron Scattering from Vitreous Silica. V. the Structure of Vitreous Silica: What Have We Learned from 60 Years of Diffraction Studies", Journal of Non-Crystalline Solids, 179, pp. 84-115, (1994).
Wright, "The Great Crystallite Versus Random Network Controversy: A Personal Perspective", International Journal of Applied Glass Science, vol. 5, pp. 31-56, (2014).
Zachariasen, "The Atomic Arrangement of Amorphouse Silicon", J. Am. Chem. Soc., vol. 54, pp. 3841-3851 (1932).
Zandiatashbar, et al., "Effect of Defects on the Intrinsic Strength and Stiffness of Graphene", Nature Communications, 5:3186, pp. 1-9, (2014).
Zhang, et al., "Clean Transfer of Large Graphene Single Crystals for High-Intactness Suspended Membranes and Liquid Cells", Advanced Materials, 29, pp. 1700639 (1-7), (2017).
Zhang, et al., "Fracture Toughness of Graphene", Nature Communications, 5:3782, pp. 1-7, (2014).
Zhang, et al., "Thermal Conductivity of Graphene Nanoribbons Under Shear Deformation: a Molecular Dynamics Simulation", Scientific Reports, 7:41398, pp. 1-8, (2017).
Zhuang, et al., "Evolution of Domains and Grain Boundaries in Graphene: a Kinetic Monte Carlo Simulation", Phys. Chem. Chem. Phys., 18, pp. 2932-2939, (2016).
Ex-Parte Quayle Action for U.S. Appl. No. 15/901,099, Aug. 19, 2020, 9 Pages.
U.S. Appl. No. 62/463,112, downloaded on Jan. 8, 2025.
U.S. Appl. No. 62/546,680, downloaded on Jan. 8, 2025.
First Office Action received in Chinese Application No. 202180033843.X dated Dec. 18, 2023, 22 Pages.
Non Final Office Action received in U.S. Appl. No. 16/049,034 mailed Aug. 21, 2020, 25 Pages.
Non-Final Office Action for U.S. Appl. No. 15/901,099, Apr. 1, 2020, 11 Pages.
Non-Final Office Action for U.S. Appl. No. 15/901,099, Jan. 13, 2021, 11 Pages.
Non-Final Office Action for U.S. Appl. No. 16/049,034, Mar. 31, 2020, 20 Pages.
Non-Final Office Action received in U.S. Appl. No. 16/181,656 mailed Aug. 19, 2020, 14 Pages.
Non-Final Office Ation for U.S. Appl. No. 17/030,480 dated Mar. 26, 2024, 71 Pages.
Notice for Eligibility of Grant for Singapore Patent Application No. 11201907148S and Supplementary Examination Report, Dec. 7, 2023, 4 Pages.
Notice of Allowance for Japanese Patent Application No. 2021-166403, Jun. 28, 2022, 6 Pages.
Notice of Allowance for Japanese Patent Application No. 2022-117400, May 9, 2024, 6 Pages.
Notice of Allowance for Korean Patent Application No. 10-2021-7001792, May 22, 2023, 3 Pages.
Notice of Allowance for Korean Patent Application No. 10-2019-7027503, Jul. 26, 2023, 9 Pages.
Lee, et al., "Establishment of Feeder-Free Culture System for Human Induced Pluripotent Stem Cell on DAS Nanocrystalline Graphene", Scientific Reports 6, 20708 (2016).
Notice of Allowance received in Japanese Application No. 2019-546155, Nov. 16, 2021, 5 Pages.
Notice of Reasons for Refusal for Japanese Patent Application No. 2019-546155, Nov. 17, 2020, 9 Pages.
Notice of Reasons for Refusal for Japanese Patent Application No. 2022554483, Nov. 7, 2024, 4 Pages.
Notification of Fulfilling of Registration Formality for Chinese Patent Application No. 201980050734.1, May 1, 2024, 7 Pages.
Notification of Re-examination received in Chinese Application No. 201980050734.1 mailed Nov. 27, 2023, 13 Pages.
Office Action for Chinese Patent Application No. 201880013364.X, Sep. 14, 2023, 12 Pages.
Office Action for Japanese Patent Application No. 2022-117400, Sep. 12, 2023, 9 Pages.
Office Action received in Japanese Application No. 2019-546155, Jun. 8, 2021, 8 Pages.
Office Action received in Japanese Patent Application No. 2021-166403, Jan. 18, 2022, 6 Pages.
Official Action received in Japanese Application No. 2021-505189 dated Sep. 16, 2022, 9 Pages.
Official Action received in Korean Application No. 10-2019-7027503 dated Nov. 11, 2022, 13 Pages.
Official Action received in Korean Application No. 10-2021-7001792 dated Oct. 31, 2022, 13 Pages.
The Decision of Final Rejection for Chinese Patent Application No. 201980050734.1, Jan. 5, 2023, 15 Pages.
The Extended European Search Report for European Patent Application No. 18757600.4, Nov. 19, 2020, 9 Pages.
The First Office Action for Chinese Patent Application No. 201980050734.1, Issued Sep. 13, 2021, 15 Pages.
The International Preliminary Report on Patentability for International Patent Application No. PCT/SG2018/050082, Date of Issuance: Aug. 27, 2019, 8 Pages.
The International Preliminary Report on Patentability for International Patent Application No. PCT/SG2021/050118, Date of Mailing: Sep. 22, 2022, 8 Pages.
The International Search Report and the Written Opinion for International Application No. PCT/SG2019/050374, Date of Mailing: Oct. 3, 2019, 11 Pages.
The Second Office Action for Chinese Patent Application No. 201880013364.X, Mar. 20, 2024, 15 Pages.
The Second Office Action for Chinese Patent Application No. 201980050734.1, Mar. 30, 2022, 19 Pages.
The Second Office Action for Chinese Patent Application No. 202180033843.X, Aug. 24, 2024, 7 Pages.
The Third Office Action for Chinese Patent Application No. 201980050734.1, Jun. 22, 2022, 15 Pages.
Written Opinion received in Singapore Application No. 11202252887H dated Sep. 13, 2024, 8 Pages.
Chae, et al., "Mass Transport through a Proton Exchange Membrane (Nafion) in Microbial Fuel Cells", Energy & Fuels, 22, pp. 169-176 (2008).
Choi, et al., "Effects of Substrate Conductivity on Cell Morphogenesis and Proliferation Using Tailored, Atomic Layer Deposition-grown ZnO Thin Films", Scientific Reports, vol. 5 Issue 9974, 2015, pp. 1-9.
Dalby, et al., "The Control of Human Mesenchymal Cell Differentiation Using Nanoscale Symmetry and Disorder", Nature Materials 6, 997-1003 (2007).
Das, et al., "Measurements of Adhesion Energy of Graphene to Metallic Substrates", Carbon 59, 121-129 (2013).

(56) References Cited

OTHER PUBLICATIONS

Discher, et al., "Growth Factors, Matrices, and Forces Combine and Control Stem Cells", Science 324, 1673-1677 (2009).
Dwivedi, et al., "Understanding the Role of Nitrogen in Plasma-Assisted Surface Modification of Magnetic Recording Media with and without Ultrathin Carbon Overcoats", Scientific Reports, vol. 5, No. 7772, 2015, pp. 1-13.
Engler, et al., "Matrix Elasticity Directs Stem Cell Lineage Specification", Cell 126, 677-689 (2006).
Ferrari, et al., "Interpretation of Raman Spectra of Disordered and Amorphous Carbon", Physical Review B 61, 14095-14107 (2000).
Hu, et al., "Proton Transport Through One-atom-thick Crystals", Nature, 516, 2014, pp. 227-230.
Kotakoski, et al., "From Point Defects in Graphene to Two-Dimensional Amorphous Carbon", Physical Review Letters, 2011, vol. 106, Article No. 105505, pp. 1-4.
Kotakoski, "Toward Two-Dimensional All-Caron Heterostructures via Ion Beam Patterning of Single-Layer Graphene", Nano Letters, vol. 15, pp. 5944-5949 (2015).
Final Office Action for U.S. Appl. No. 16/181,656 mailed Dec. 3, 2020, 12 Pages.
Final Office Action received in U.S. Appl. No. 17/030,480 mailed Sep. 12, 2024, 7 Pages.
Notice of Allowance for U.S. Appl. No. 15/901,099 mailed Aug. 6, 2021, 11 Pages.
Notice of Allowance for U.S. Appl. No. 16/181,656 mailed Mar. 3, 2021, 8 Pages.
Notice of Allowance for U.S. Appl. No. 17/030,480 mailed Jan. 2, 2025, 8 Pages.
Adliene, et al., "Radiation Induced Changes in Amorphous Hydrogenated DLC Films", Materials Science and Engineering B, 152 (2008) 91-95.
Wang, et al., "Controllable Synthesis of 2D Amorphous Carbon and Partially Graphitic Carbon Materials: Large Improvement of Electrochemical Performance by the Redox Additive of Sulfanilic Acid Azochromotrop in KOH Electrolyte", Electrochimica Acta; vol. 200, pp. 247-258, (2016).

* cited by examiner

SEED LAYER, A HETEROSTRUCTURE COMPRISING THE SEED LAYER AND A METHOD OF FORMING A LAYER OF MATERIAL USING THE SEED LAYER

CROSS-REFERENCE TO RELATED APPLICATIONS

The present application is a national phase entry under 35 U.S.C. § 371 of International Application No. PCT/SG2021/050118, filed Mar. 9, 2021, published as International Publication No. WO 2021/183050 A1, which claims the benefit of Singapore patent application Ser. No. 10/202,002196X, filed Mar. 10, 2020, the disclosures of all of which are hereby incorporated by reference in their entirety.

TECHNICAL FIELD

The present disclosure relates to a seed layer, a heterostructure comprising the seed layer, and also a method of forming a layer of material using the seed layer.

BACKGROUND

Integration of heterogeneous materials is an important aspect for fabricating high performance semiconducting devices. For example, high speed and efficient optoelectronic devices such as light emitting diodes, infrared (IR) sensors, photodetectors and solar cells generally involve multilayer heterostructures which require integration of group III-V (GaAs, GaN, InP and others) and group II-VI (CdTe, CdS, ZnS, oxides and others) semiconductors with silicon (Si) microelectronics. The advantages of such integration are attributed to the superior optoelectronic properties achieved from the group III-V or the group II-VI materials, and the economic viability and compatibility of Si with complementary metal oxide semiconductor (CMOS) technology.

A conventional technique employed for forming such multilayer heterostructures is epitaxial growth, where an epilayer of material grown on a substrate is covalently bonded to the underlying substrate material. However, stringent requirements need to be fulfilled in order to achieve a reasonable quality of such multilayer heterostructures, thereby imposing restriction to its universal applicability. For example, direct heteroepitaxy of group III-V or group II-VI materials on Si using conventional epitaxial growth methods is generally not possible due to thermal expansion, polarity and lattice mismatch between the group III-V or group II-VI materials with Si.

One way to overcome this is by using van der Waals epitaxy (vdWE) technique. The van der Waals epitaxy (vdWE) technique is based on non-covalent interactions between adatoms and a substrate surface. The non-covalent interaction relaxes the lattice alignment requirement and allows materials with comparatively large mismatch to grow on each other. With its compatibility to the growth of two-dimensional (2D) materials, the vdWE technique has become a material growth method of interest in recent years for advancing the fabrication of semiconducting devices. Unfortunately, a crystalline 2D material typically lacks dangling bonds on its surface and therefore offers very low surface energy and adsorption energy for adatoms during subsequent epitaxial growth. This makes growth of heterostructures using the vdWE technique challenging for achieving uniform, strain-free films, which often results in island-type growths, low growth rates and defective films for the subsequent epitaxial growth. This inadvertently affects device performances of the resultant devices. The integration of a three-dimensional (3D) material on a 2D material is even more challenging given the weak vdW interactions employed in this vdWE technique. The weak vdW interaction leads to very low wetting of a surface of the 2D material by a typical 3D material, resulting in the formation of non-uniform, strained and clustered 3D material films instead of uniform, planar ones.

It is therefore desirable to provide a seed layer, a heterostructure comprising the seed layer, and a method of forming a layer of material using the seed layer which address the aforementioned problems and/or provide a useful alternative. Further, other desirable features and characteristics will become apparent from the subsequent detailed description and the appended claims, taken in conjunction with the accompanying drawings and this background of the disclosure.

SUMMARY

Aspects of the present application relate to a seed layer, a method of forming the seed layer, a heterostructure comprising the seed layer, a device comprising the heterostructure, a method of forming a layer of material using the seed layer and a method of enhancing van der Waals (vdW) interaction between adatoms and a surface of the seed layer.

In accordance with a first aspect, there is provided a seed layer for inducing nucleation to form a layer of material. The seed layer comprising a layer of two-dimensional (2D) monolayer amorphous material having a disordered atomic structure adapted to create localised electronic states to form electric potential wells for bonding adatoms to a surface of the seed layer via van der Waals (vdW) interaction to form the layer of material, wherein each of the electric potential wells has a potential energy larger in magnitude than surrounding thermal energy to capture adatoms on the surface of the seed layer.

By using a seed layer comprising a layer of two-dimensional (2D) monolayer amorphous material having a disordered atomic structure, localised electronic states are created by the disordered atomic structure to form the electric potential wells which act as high energy sites for adsorbing adatoms during a growth of the layer of material via vdW interaction. This results in a stronger interaction between the adatoms and the surface of the seed layer and a higher nucleation density of adatoms on the surface of the seed layer (e.g. when compared with conventional vdW epitaxy), which work together to enhance a wettability of the adatoms on the surface of the seed layer for achieving uniform planar material layer growth. Moreover, the disordered atomic structure of the seed layer can also be tuned from a completely amorphous phase to a nanocrystalline phase for modulating an interaction between an underlying substrate and the layer of material, thereby providing a useful handle for remotely controlling the growth of this layer of material. Further, since growth of the layer of material is derived from the vdW interaction between the adatoms and the seed layer, the seed layer functions as a universal seed layer for allowing any material layer to be grown on any substrate. Still further, a stronger vdW interaction between the surface of the seed layer and the layer of material allows the grown layer of material to be detached from the underlying substrate to create freestanding films which may be advantageous in a design of a heterostructure electronic device.

The layer of 2D monolayer amorphous material may comprise a 2D monolayer amorphous carbon.

The seed layer may have an optical transparency of more than 98% at a light wavelength between 550 nm to 800 nm.

The seed layer may be thermally stable from room temperature up to 700° C., from room temperature up to 600° C., from room temperature up to 500° C., from room temperature up to 400° C., from room temperature up to 300° C., from room temperature up to 200° C., from room temperature up to 100° C. or at a temperature between 600° C. and 700° C., between 500° C. and 700° C., between 400° C. and 700° C., between 300° C. and 700° C., between 200° C. and 700° C., between 100° C. and 700° C., between 20° C. and 700° C., or at 700° C.

The seed layer may comprise one or more additional layers of 2D monolayer amorphous material deposited on the layer of 2D monolayer amorphous material to form a multilayer structure of the seed layer.

In accordance with a second aspect, there is provided a method of forming a seed layer, the seed layer comprising a layer of two-dimensional (2D) monolayer amorphous material having a disordered atomic structure adapted to create localised electronic states to form electric potential wells for bonding adatoms to a surface of the seed layer via van der Waals (vdW) interaction to form a layer of material, wherein each of the electric potential wells has a potential energy larger in magnitude than surrounding thermal energy to capture adatoms on the surface of the seed layer, the method comprising: growing the seed layer on a substrate using laser-assisted chemical vapour deposition (LCVD).

The LCVD enables non-catalytic growth of the seed layer directly on a variety of substrates (metals, semiconductor, insulators, glass and polymers) at a low temperature, by making use of a photolytic decomposition process. The photolytic decomposition refers to the use of one or more photons to induce a chemical reaction of a molecule to break the molecule down into simpler particles. This provides a number of advantages. First, the use of laser assisted CVD allows for direct growth of the seed layer on a substrate of interest and so it bypasses the commonly practiced time-consuming transfer method which is required when the seed layer or the material of interest can be grown only on a specific base substrate. Second, by being able to grow the seed layer on a substrate of interest and bypassing the transfer method, it provides a cleaner surface of the seed layer for subsequent growth of the layer of material since the growth of the layer of material can be formed in-situ in a same CVD or growth process. This reduces potential impurities on the surface of the seed layer, thereby allowing formation of a defect-free uniform planar layer of material on the seed layer. For clarity, it should be appreciated that the subsequent growth of the layer of material is not limited to LCVD. Other suitable growth processes for forming the layer of material (e.g. 2D, 3D or oxide materials) can be used where the growth processes can be implemented in-situ. Third, the LCVD process enables lower temperature growth of the seed layer on the base substrate, thereby retaining a pristine surface and crystallinity of the material of the base substrate for the subsequent growth, particularly if the material of the base substrate has a low thermal stability (e.g. thermally stable at a temperature below 300° C. or 400° C.). Fourth, the low temperature laser assisted CVD process is also compatible with conventional semiconducting processing technology.

In accordance with a third aspect, there is provided a heterostructure comprising: a substrate; and a seed layer formed on the substrate, the seed layer comprising a layer of two-dimensional (2D) monolayer amorphous material having a disordered atomic structure adapted to create localised electronic states to form electric potential wells for bonding adatoms to a surface of the seed layer via van der Waals (vdW) interaction, wherein each of the electric potential wells has a potential energy larger in magnitude than surrounding thermal energy to capture adatoms on the surface of the seed layer.

The substrate may comprise one of: a metal, a semiconductor, an insulator, glass, a polymer, silicon, silicon carbide, sapphire, a group III-V substrate, a group II-VI substrate or an oxide.

Where the substrate is a crystalline substrate, the seed layer may be adapted to screen effects provided by a crystallinity of the crystalline substrate.

The heterostructure may comprise a layer of material formed on the seed layer, the layer of material being formed by bonding adatoms of the material to the surface of the seed layer via the van der Waals (vdW) interaction.

The layer of material may comprise one or more layers of a 2D material, the 2D material comprises one of: graphene, borophene, boron nitride, a perovskite, a transition metal dichalcogenide or a black phosphorene.

The layer of material may comprise one or more layers of a group III-V semiconducting material.

The group III-V semiconducting material may comprise one of: GaAs, GaN, AlN, InP and InN.

The layer of material may comprise one or more layers of a group II-VI semiconducting material.

The group II-VI semiconducting material may comprise one of: CdTe, CdS and ZnS.

The layer of material may comprise one or more layers of an oxide.

The oxide may comprise one of: hafnium oxide, aluminium oxide, manganese oxide, perovskite or spinel.

The seed layer may comprise a 2D monolayer amorphous carbon.

In accordance with a fourth aspect, there is provided a device comprising any preceding heterostructure.

In accordance with a fifth aspect, there is provided a method of forming a layer of material on a substrate. The method comprising: forming a seed layer on the substrate, the seed layer comprising a layer of two-dimensional (2D) monolayer amorphous material having a disordered atomic structure adapted to create localised electronic states to form electric potential wells for bonding adatoms to a surface of the seed layer via van der Waals (vdW) interaction, wherein each of the electric potential wells has a potential energy larger in magnitude than surrounding thermal energy to capture adatoms on the surface of the seed layer; and forming the layer of material on the seed layer by bonding adatoms of the material to the surface of the seed layer via the van der Waals (vdVV) interaction.

The method may comprise varying the disordered atomic structure of the layer of 2D monolayer amorphous material to modulate a strength of the vdW interaction between the adatoms of the material and the surface of the seed layer.

The method may comprise: forming a handling layer on the layer of material; and detaching the seed layer from the substrate to form a free-standing film comprising the seed layer and the layer of material.

Forming the seed layer on the substrate may comprise growing the seed layer on the substrate using laser-assisted chemical vapour deposition (LCVD).

The laser-assisted CVD may be performed at a temperature between room temperature (e.g. 20° C.) and 400° C., between 20° C. and 50° C., between 20° C. and 100° C., between 20° C. and 150° C., between 20° C. and 200° C., between 20° C. and 300° C., between 100° C. and 200° C., between 100° C. and 300° C., between 200° C. and 300° C., between 200° C. and 400° C. or between 300° C. and 400° C. In some embodiments, a temperature range of between 20° C. and 300° C. or between 20° C. and 400° C. may be advantageous as this is complementary to industrial processes given that complementary metal oxide semiconductor (CMOS) technology typically has temperature limitations within these temperature ranges. For example, nanometre size domains in thin film materials may be damaged if they are exposed to high temperatures of above 300° C. or 400° C. In some embodiments, growing the seed layer using LCVD at room temperature may be advantageous since no heating is required for the LCVD growth process and therefore the growth equipment used may not need to be equipped with a heater or suitable heat isolation/containment. Further, eliminating heating for the LCVD growth of the seed layer also reduces the energy consumption and therefore the overall costs of the material growth.

In accordance with a sixth aspect, there is provided a method for enhancing van der Waals (vdW) interaction between adatoms and a surface of a seed layer for forming a layer of material on the seed layer. The seed layer comprises a layer of two-dimensional (2D) monolayer, and the method comprises: creating a disordered atomic structure in the seed layer, the disordered atomic structure of the seed layer being adapted to create localised electronic states to form electric potential wells for bonding the adatoms to the surface of the seed layer via the vdW interaction to form the layer of material, wherein each of the electric potential wells has a potential energy larger in magnitude than surrounding thermal energy to capture adatoms on the surface of the seed layer.

It should be appreciated that features relating to one aspect may be applicable to the other aspects. Embodiments therefore provide a seed layer comprising a layer of two-dimensional (2D) monolayer amorphous material having a disordered atomic structure, where localised electronic states are created by the disordered atomic structure to form electric potential wells which act as high energy sites for adsorbing adatoms during a growth of the layer of material via vdW interaction. This results in a stronger interaction between the adatoms and the surface of the seed layer and a higher nucleation density of adatoms on the surface of the seed layer, which work together to enhance a wettability of the adatoms on the surface of the seed layer for achieving uniform planar material layer growth. Moreover, the disordered atomic structure of the seed layer can also be tuned from a completely amorphous phase to a nanocrystalline phase for modulating an interaction between an underlying substrate and the layer of material, thereby providing a useful handle for remotely controlling the growth of this layer of material. Further, a stronger vdW interaction between the surface of the seed layer and the layer of material allows the grown layer of material to be detached from the underlying substrate to create freestanding films, which may be advantageous in a design of heterostructure electronic devices.

BRIEF DESCRIPTION OF THE DRAWINGS

Embodiments will now be described, by way of example only, with reference to the following drawings, in which:

FIG. 11A shows a STEM image of a MAC film and FIG. 11B shows a STEM image of a nanocrystalline graphene film;

FIG. 12A shows a Raman spectrum of the MAC before the temperature treatment and FIG. 12B shows a Raman spectrum of the MAC after the temperature treatment;

FIG. 16A shows an optical image of $MoS_2$ grown on silicon dioxide ($SiO_2$), FIG. 16B shows an optical image of $MoS_2$ grown on a monolayer of MAC on $SiO_2$, and FIG. 16C shows an optical image of $MoS_2$ grown on a few layers of MAC on $SiO_2$;

FIG. 17A shows SEM images of $MoS_2$ grown directly on the sapphire substrate and on a monolayer of MAC on the sapphire substrate, and FIG. 17B shows a zoom-in SEM image of the $MoS_2$ grown on the monolayer of MAC on the sapphire substrate;

FIG. 18A shows SEM images of $MoS_2$ grown directly on the sapphire substrate and on a few layers of MAC on the sapphire substrate, and FIG. 18B shows a zoom-in SEM image of the $MoS_2$ grown on the few layers of MAC on the sapphire substrate.

DETAILED DESCRIPTION

Figure 1:
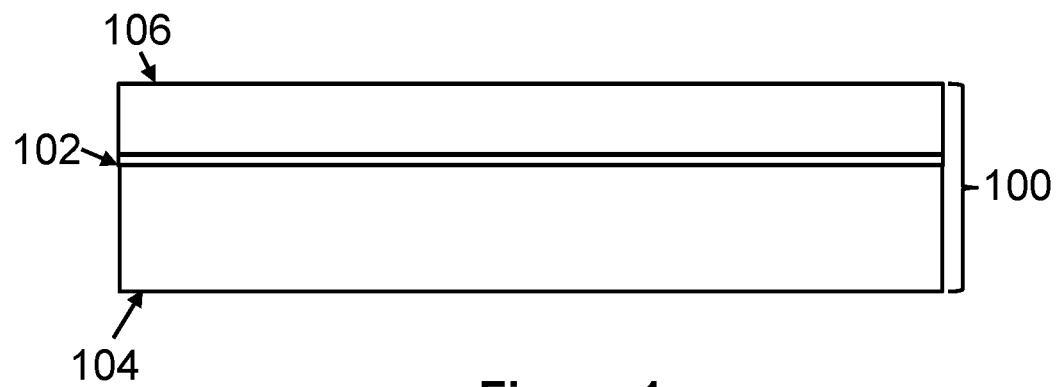
FIG. 1 shows a schematic structure of a heterostructure comprising a seed layer in accordance with an embodiment.

Exemplary embodiments relate to a seed layer, a method of forming the seed layer, a heterostructure comprising the seed layer, a device comprising the heterostructure, a method of forming a layer of material using the seed layer and a method of enhancing vdW interaction between adatoms and a surface of the seed layer.

It is appreciated that in the present application, the use of the singular includes the plural unless specifically stated otherwise. It should be noted that, as used in the specification and the appended claims, the singular forms "a", "an" and "the" include plural referents unless the context clearly dictates otherwise. Further, the use of the term "including", "comprising", and "having" as well as other forms, such as "include", "comprise", "have" are not considered limiting.

In the present application, the device and/or heterostructure as described herein may be operable in various orientations, and thus it should be understood that the terms "top", "base", "underlying" etc. when used in the following description are used for convenience and to aid understanding of relative positions or directions, and not intended to limit the orientation of the device and/or heterostructure.

As used herein, the term "and/or" includes any and all combinations of one or more of the associated listed items.

In the present embodiments, by using a seed layer comprising a layer of two-dimensional (2D) monolayer amorphous material having a disordered atomic structure where localised electronic states are created by the disordered atomic structure to form electric potential wells, the seed layer is provided with high energy sites for adsorbing adatoms during a growth of the layer of material via vdW interaction. The localised electronic states refer to a distribution of electronic states within the 2D monolayer amorphous material which are not extended to overlap with one another. Particularly, in a disordered material system, these localised electronic states are sufficiently isolated from one another which may lead to an absence of electrical conduction of the 2D monolayer amorphous material. An electric potential well formed by the localised electronic states of the 2D monolayer amorphous material refers to a trapping site which has a potential energy larger in magnitude than available surrounding thermal energy so as to capture adatoms on the surface of the seed layer, preferably at locations of these electric potential wells. These electric potential wells formed by the localised electronic states created by the disordered atomic structure of the 2D monolayer amorphous material provide a strong interaction between the adatoms and the surface of the seed layer and a high nucleation density of adatoms on the surface of the seed layer, which work together to enhance a wettability of the adatoms on the surface of the seed layer for achieving a subsequent uniform planar material layer growth. In the present case, enhancing the wettability of the adatoms refers to improving an attraction force between the adatoms and the surface of the seed layer so that this attraction force is stronger than an attractive interaction force between the adatoms. Enhancing a wettability of the adatoms leads to formation of a uniform distribution of adatoms on the surface of the seed layer, instead of formation of clusters of adatoms on the surface. Moreover, the disordered atomic structure of the seed layer can also be tuned from a completely amorphous phase to a nanocrystalline phase for modulating an interaction between an underlying substrate and the layer of material, thereby providing a useful handle for remotely controlling the growth of this layer of material. Further, a strong vdW interaction between the surface of the seed layer and the layer of material allows the grown layer of material to be detached from the underlying substrate to create freestanding films which may be advantageous in a design of a heterostructure electronic device. In the current context, the term "amorphous material" refers to a material that lacks the long-range order which is typical of a crystalline material. The term "monolayer" refers to a one-atom thick layer, which may range from a few angstroms (Å) to a few nanometres thick.

FIG. 1 shows a schematic structure of a heterostructure 100 in accordance with an embodiment. The heterostructure 100 comprises a seed layer 102 formed on a substrate 104. As shown in FIG. 1, the seed layer 102 is formed directly on the substrate 104 (i.e. the seed layer 102 is formed on top of and adjacent to the substrate 104). The substrate 104 provides structural support for the seed layer 102. The heterostructure 100 also includes a layer of material 106 formed on the seed layer 102. The layer of material 106 includes any material of interest and this will be further described in relation to FIGS. 14 and 15 below. The seed layer 102 comprises a layer of two-dimensional (2D) monolayer amorphous material having a disordered atomic structure. The disordered atomic structure is adapted to create localised electronic states to form electric potential wells for bonding adatoms to a surface of the seed layer 102 via van der Waals (vdW) interaction to form the layer of material 106. The seed layer 102 comprising the layer of 2D monolayer amorphous material may be formed by any 2D material, as long as the seed layer 102 has a disordered atomic structure which creates localised electronic states for forming electric potential wells for enhancing the vdW interaction between the adatoms and the surface of the seed layer 102.

In the embodiments as described below, a monolayer amorphous carbon (MAC) is used as an exemplary 2D monolayer amorphous material for the seed layer 102. FIGS. 2 to 19 will be described in relation to using one or more layers of the MAC as the seed layer 102. A MAC comprises $sp^2$-bonded carbon lattice which retains similar vdW interaction as a graphene monolayer, but provides additional vdW interaction from its disordered atomic structure which creates localised electronic states that can act as a driving force for aligning adatoms in-plane to a surface of the MAC. When using the MAC as the seed layer 102, this results in a higher surface wettability (e.g. as compared to graphene or other crystalline 2D materials) of the adatoms on the surface of the seed layer 102, thereby enabling uniform and planar growth of the layer of material 106. This makes MAC, in contrast to e.g. graphene, an ideal candidate as the seed layer 102 for epitaxial and/or non-epitaxial growth of a variety of material films.

Figure 2:
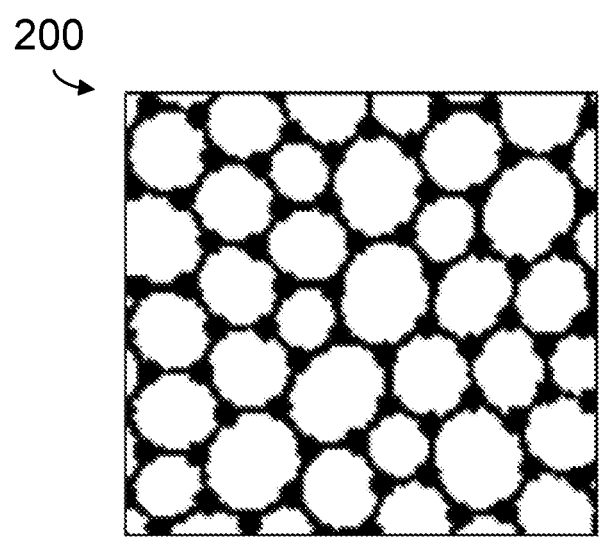
FIG. 2 shows a schematic of a planar view of a seed layer comprising a monolayer amorphous carbon (MAC) in accordance with an embodiment.

FIG. 2 shows a schematic of a planar view 200 of a seed layer comprising the MAC.

As shown in FIG. 2, the MAC comprises a disordered atomic arrangement with a continuous network of disordered $sp^2$ carbon (C) atoms in two dimensions (2D) without any grain boundaries (homogeneous). This is in contrast to conventional polycrystalline graphene which includes ordered crystalline domains separated with grain-boundaries (inhomogeneous). Due to the lack of grain boundaries in a MAC seed layer 102, the disclosed MAC seed layer 102 is ultra-strong, making it suitable for applications that may require deformation such as bending and stretching. In the MAC, a ratio of hexagonal carbon rings to a total number of carbon rings (i.e. the total number of hexagonal and non-hexagonal carbon rings) may be less than 1.

Figure 3:
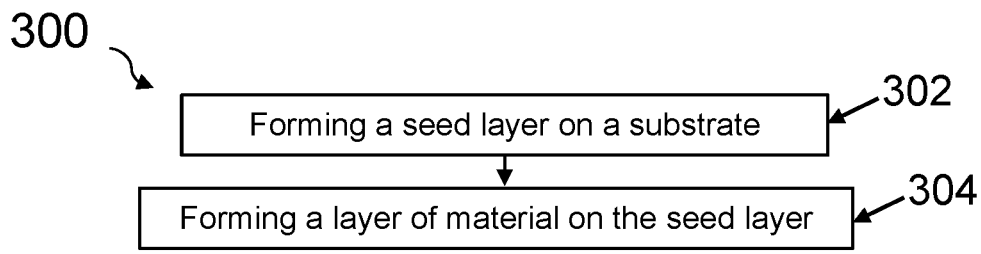
FIG. 3 shows a flowchart showing steps of a method for forming the heterostructure of FIG. 1.

FIG. 3 shows a flowchart showing steps of a method 300 for forming the heterostructure 100 of FIG. 1.

In a step 302, the seed layer 102 is formed on the substrate 104. In the present embodiment, the seed layer 102 comprises a monolayer amorphous carbon (MAC), and the substrate 104 comprises a sapphire substrate. In the present embodiment, the MAC is formed using a laser-assisted chemical vapour deposition (LCVD) process with hydrocarbons as precursors (e.g. $CH_4$, $C_2H_2$ etc.) at room temperature. Hydrogen gas ($H_2$) and Argon gas (Ar) may also be mixed with the precursor. In this LCVD process, the laser functions both as an energy source to breakdown the precursor gas in a process called photolytic decomposition, and as a local heat source. In the present embodiment, the LCVD process for producing the MAC seed layer 102 uses the following parameters: (i) process gas: $C_2H_2$; (ii) chamber pressure: $2\times10^{-2}$ mbar; (iii) laser fluence: 70 mJ/cm; (iv) growth time: 1 min; (v) plasma power: 5 W. Although the LCVD process is used for forming the MAC in the present embodiment, it will be appreciated that the LCVD process can also be used for forming non-carbon based seed layer 102 in other embodiments.

The above exemplary process employs the use of acetylene ($C_2H_2$) within the growth chamber for the growth process. The gas pressure within the chamber during the growth is controlled at $2\times10^{-2}$ mbar throughout. This gas is in the presence of a plasma generator operating at 5 W power. The growth starts when a 248 nm excimer laser is exposed on the surface of the sapphire substrate 104 with a fluence of 70 mJ/cm with a pulse frequency of 50 Hz. The laser exposure time (i.e., growth duration) is set at 1 min to obtain a continuous MAC seed layer 102 on the substrate 104. In this growth, the stage heater is not used. Multiple parameters disclosed herein may be adjusted, for controlling and/or changing the properties of the disclosed MAC seed layer 102 including, but not limited to, hydrocarbons as precursors, precursor mixes, adjustments to the photolytic decomposition process and equipment, temperature regulations, substrate temperature adjustment, the change in C value, change in number of atomic layers, change in $sp^2$ to spa ratio, and change in adhesion to the substrate 104. In the present embodiment, a thickness of the MAC seed layer 102 is designed to be at approximately one atomic layer thick.

Further, it should be appreciated that use of the photolytic decomposition approach for forming the seed layer 102 as described above is distinct from the typical approach of forming a 2D material film using e.g. thermal CVD (TCVD). Particularly, TCVD requires a hot substrate for the chemical reactions of bond breaking and bond forming of adatoms to occur on a surface of the substrate. However, a temperature required for such reactions to occur is typically much higher than the crystallisation temperature of a 2D material. This means that at the minimum growth temperature required to form a 2D material film on the surface of the substrate, the atoms of the 2D material deposited on the substrate surface are highly mobile (e.g. surface diffusion) and will reorder themselves leading to some degree of crystallisation during formation of the 2D material. As a result, the 2D material film formed will be in varying degree of crystallinity, and cannot be completely or fully amorphous. In contrast, by using the photolytic decomposition approach, energy from the laser breaks the bonds of the precursor gas and provides additional energy for subsequent 2D material film formation when the atoms of the 2D material are deposited on the substrate surface at a lower temperature (e.g. at room temperature, or at a temperature below the crystallisation temperature).

Therefore, by using the photolytic decomposition approach at low temperatures, the deposited atoms of the 2D material are less mobile and are unlikely to move after landing on the surface of the substrate. This limitation in atomic motions of the atoms (surface diffusion) prevents crystal formation of the 2D material. A monolayer amorphous film can therefore be formed.

By using the photolytic decomposition method for forming the MAC seed layer 102 as described above, a number of advantages can be provided. First, the MAC seed layer 102 as synthesised by LCVD can be integrated with existing semiconductor processing technology. Particularly, LCVD is an industrially scalable process which can achieve high throughput of large area films. Therefore the LCVD process for seed layer formation can be integrated easily with current semiconductor processing technology, making the process industrially compatible and scalable. In addition, LCVD is an ultrafast deposition technology, where an entire surface of the substrate 104 can be covered with a MAC film in under 60 seconds. LCVD is thus more efficient than the widely employed atomic layer deposition (ALD) process.

Second, using LCVD means that the MAC seed layer 102 can be synthesized at low temperatures of less than 300° C. (for example as low as 200° C. or even at room temperature), which is compatible with silicon-based technologies. Also, in contrast to the growth of graphene, the cost of MAC growth using LCVD is significantly lower since less energy is required for the LCVD growth as compared to the conventional thermal chemical vapor deposition of graphene which requires a temperature of about 1000° C. Further, lowering of synthesis temperature (e.g. at a temperature between 20° C. to 150° C.) may make it possible to enable direct MAC growth on polymeric substrates used for OLED and flexible electronics. The low temperature growth of MAC as the seed layer 102 is also advantageous as it minimises a disruption of a lattice or surface reconstruction of a single-crystal substrate, retaining a pristine and smooth interface between the seed layer 102 and the substrate 104.

Third, with the low-temperature photolytic growth of MAC by LCVD, direct growth of a MAC seed layer 102 can be performed on a variety of substrates (including Si, single crystals, polycrystalline, metals, glass, polymers and others). Also, subsequent growth of the layer of material 106 on the seed layer 102 is governed by the vdW interaction of a surface of the MAC seed layer and adsorbing adatoms, thereby minimising a role of the substrate 104 on this subsequent material growth. Particularly, one or more layers of MAC can be adapted to screen the underlying crystalline information of the substrate 104 and hence dominating the subsequent growth mechanism.

In a step 304, the layer of material 106 is formed or deposited on the seed layer 102. Given the stronger vdW interaction between the adatoms and the surface of the seed layer 102 as provided by the disordered atomic structure of the seed layer 102, a variety of materials can be used for forming the layer of material 106. This is further described in relation to FIGS. 14 and 15. It will therefore be appreciated that a large number of growth or deposition techniques can be used for forming the layer of material 106, depending on the material used for the layer of material 106. Examples of deposition techniques which may be applied include molecular beam epitaxy (MBE), atmospheric pressure CVD (APCVD), metal organic CVD (MOCVD), plasma enhanced CVD (PECVD), thermal CVD (TCVD)

and atomic layer deposition (ALD). Embodiments of different materials used for forming the layer of material 106 are discussed in relation to FIGS. 16A to 19.

Figure 4:
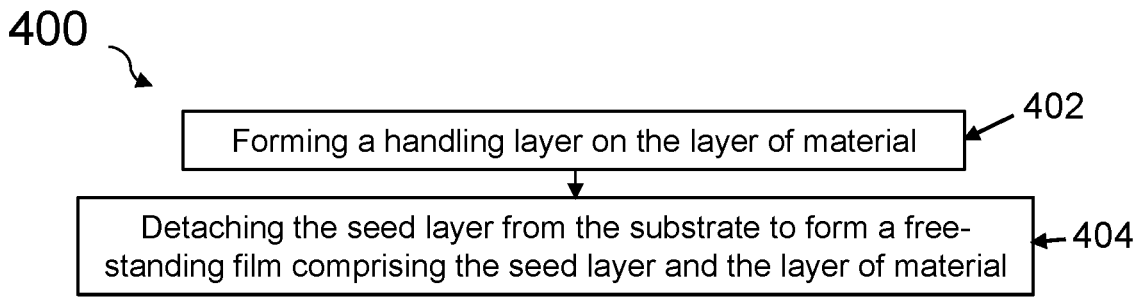
FIG. 4 shows a flowchart showing steps of a method for forming a free-standing film comprising the seed layer and the layer of material using the heterostructure of FIG. 1.

FIG. 4 shows a flowchart showing steps of a method 400 for forming a free-standing film comprising the seed layer 102 and the layer of material 106 using the heterostructure 100 of FIG. 1.

In a step 402, a handling layer is formed on the layer of material 106. In other words, the handling layer is formed on and adjacent to the layer of material 106. The handling layer includes a metal stressor layer, a flexible tape layer or a layer of adhesive material which can have a stronger adhesion to the underlying layer of material 106 as compared to the adhesion between the seed layer 102 and the substrate 104.

In a step 404, the seed layer 102 is detached from the substrate 104 to form a free-standing film. This is achieved by exfoliating or peeling the layer of material 106 and the seed layer 102 from the substrate 104 to form the free-standing film, and subsequently removing the handling layer which was formed or attached to the layer of material 106.

The exfoliation is governed by the stronger interaction between the seed layer 102 with the layer of material 106 as compared to that with the substrate 104. The stronger interface between the seed layer 102 and the layer of material 106, and the non-covalent bonding of the seed layer 102 with the underlying substrate 104 helps to exfoliate the free-standing film from the substrate 104. This is advantageous as the free standing film comprising the seed layer 102 and the layer of material 106 can be isolated for use in for example flexible and transparent optoelectronic devices, while the substrate 104 can be reused.

Figure 5:
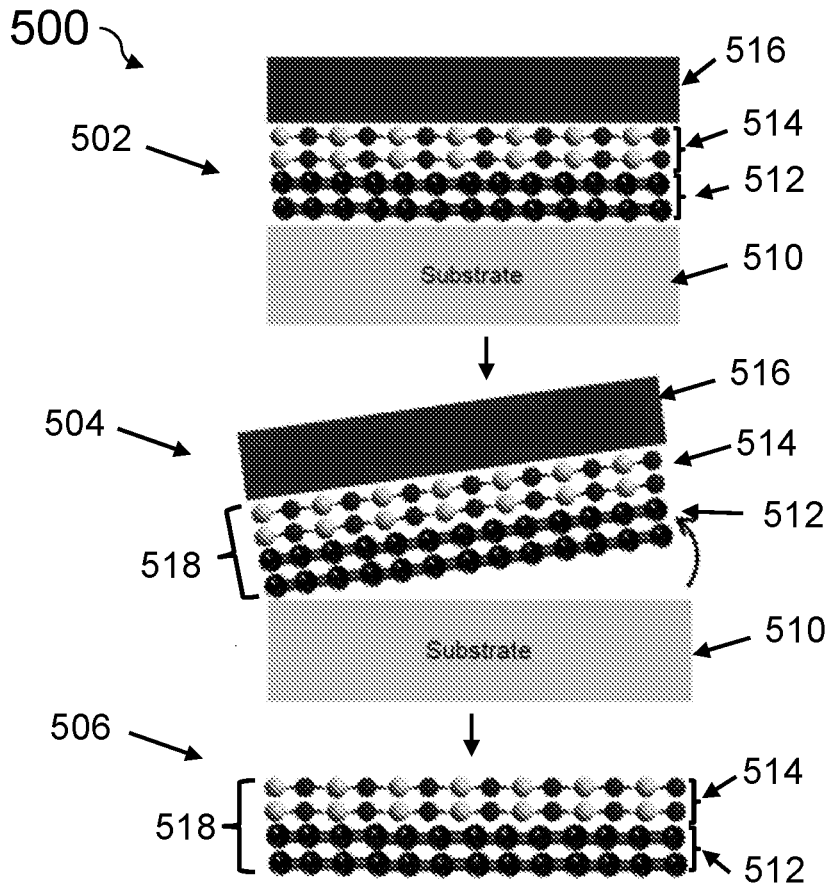
FIG. 5 shows schematic diagrams illustrating the steps of the method for forming the free-standing film in relation to FIG. 4.

FIG. 5 shows schematic diagrams 500 illustrating the steps of the method 400 for forming the free-standing film of FIG. 4. In the present embodiment, a two-layer MAC is formed on a substrate 510 and is used as the seed layer 512. A two-layer 2D material is formed on the seed layer 512 as the layer of material 514.

As shown by the schematic diagram 502, a handling layer 516 is formed on top of the layer of material 514. This corresponds to the step 402 as described above.

As shown by the schematic diagram 504, exfoliation or peeling of the layer of material 514 and the seed layer 512 from the substrate 510 is performed using the handling layer 516. The detached free-standing layer 518 comprises the layer of material 514 and the seed layer 512.

As shown by the schematic diagram 506, the handling layer 516 is subsequently removed from the free-standing layer 518. The handling layer 516 may be removed, for example, by the following ways. Where the handling layer 516 is a metal stressor layer, it may be removed by dipping the handling layer 516 in a metal etchant. Where the handling layer 516 is a flexible tape layer, the flexible tape layer may include a thermal release or a UV release adhesion that can be removed by heating or exposing the tape to the UV light, respectively.

Figure 6:
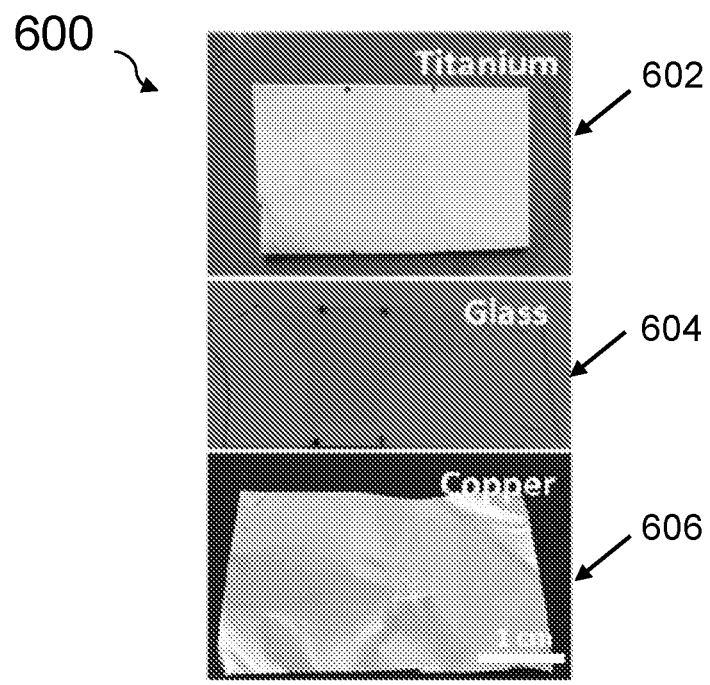
FIG. 6 shows photographs taken of as-grown MAC films on three distinctive substrates, namely, titanium, glass and copper, in accordance with an embodiment.

FIG. 6 shows photographs 600 taken of as-grown MAC films on three distinctive substrates, namely, titanium, glass and copper. As shown in FIG. 6, the photograph 602 shows an as-grown MAC film on a titanium substrate, the photograph 604 shows an as-grown MAC film on a glass substrate, and the photograph 606 shows an as-grown MAC film on a copper substrate. At least from the photograph 604, it is clear that the MAC film as deposited is transparent in visible light.

Figure 7:
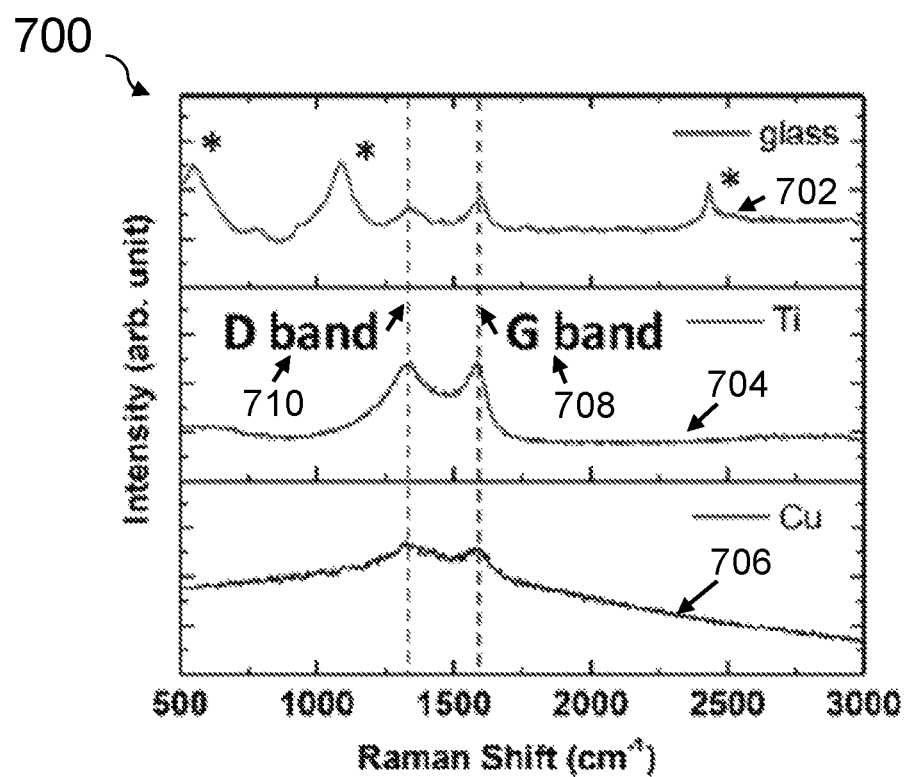
FIG. 7 shows Raman spectra of the as-grown MAC films of FIG. 6.

FIG. 7 shows Raman spectra of the as-grown MAC films of FIG. 6. The Raman spectrum 702 is obtained using the MAC film grown on the glass substrate, the Raman spectrum 704 is obtained using the MAC film grown on the titanium substrate, and the Raman spectrum 706 is obtained using the MAC film grown on the copper substrate. As shown in all of the Raman spectra 702, 704, 706 of FIG. 7, there is an absence of a 2D peak (at about 2700 cm$^{-1}$) which is typical of a crystalline graphene monolayer. In contrast, all of the Raman spectra 702, 704, 706 show broad G peaks 708 (at about 1600 cm$^{-1}$) and D peaks 710 (at about 1350 cm$^{-1}$). The broadening of D and G peaks usually indicates a transition from nanocrystalline graphene to amorphous film. The Raman spectra 702, 704, 706 also reveal a D/G-ratio in a range of about 0.5 to 1. This D/G-ratio combined with the absence of the 2D peak distinguishes the disordered atomic structure of the MAC from the structures of 2D graphene and diamond. The Raman spectra 702, 704, 706 also verified the growth of the as-grown MAC films on these three distinctive substrates.

Figure 8:
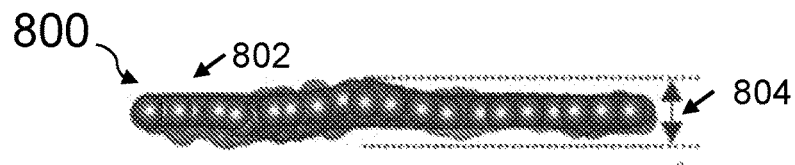
FIG. 8 shows a diagram illustrating a theoretical simulation of an out-of-plane structural relaxation within a MAC film which induces localised strain within a lattice structure of the MAC film in accordance with an embodiment.

FIG. 8 shows a diagram 800 illustrating a theoretical simulation of an out-of-plane structural relaxation within a MAC film 802 which induces localised strain in a lattice structure of the MAC film 802. In the present theoretical simulation, atomic coordinates of the atoms of the MAC film 802 in the model are initially arranged in a flat 2D plane. By taking into consideration the interaction forces between these atoms, atomic rearrangement of these atoms occurs in a 3D space, and the atomic coordinates of the atoms of the MAC film 802 take up their new equilibrium positions where the structure of the MAC film 802 is in its most stable configuration with the lowest internal energy. As shown in the diagram 800, the MAC film 802 simulated is of a monolayer and has a thickness 804 of about 6.5 Å. The amorphous or disordered atomic structure of the MAC film 802 generates a strained 2D lattice with localised electronic distribution, thereby providing a surface with relatively higher energy. Such surface initiates a strong interaction with the adsorbing adatoms resulting in higher surface wettability required for uniform and planar 2D and/or 3D material film formation. This helps to overcome a low wetting of 3D material films on a 2D surface for vdW epitaxy due to the intrinsic lower surface energy of a surface of a 2D crystalline material.

Further, the higher surface energy of the MAC 802 due to its disordered atomic arrangement and enhanced vdW interaction results in a high number of nucleation sites for adsorbed adatoms on the MAC seed layer. A high number of nucleation sites (or higher nucleation density) can substantially lower the growth rate and temperature requirement for the subsequent material layer growth, thereby making the growth process more energy and cost efficient. Moreover, the enhanced vdW interaction between the MAC 802 (i.e. the seed layer) and the layer of material (or epilayer) results in a stronger interface which is stable even during a subsequent high temperature growth process. This ensures uniformity of subsequent formation of the planar layer of material and prevents or reduces formation of islands and/or clusters during this subsequent growth of the layer of material. It is noted that the formation of islands and/or clusters in the layer of material results in non-planar active layer material films which is detrimental to a device performance of a subsequent device formed using such a non-planar material layer.

Figure 9:
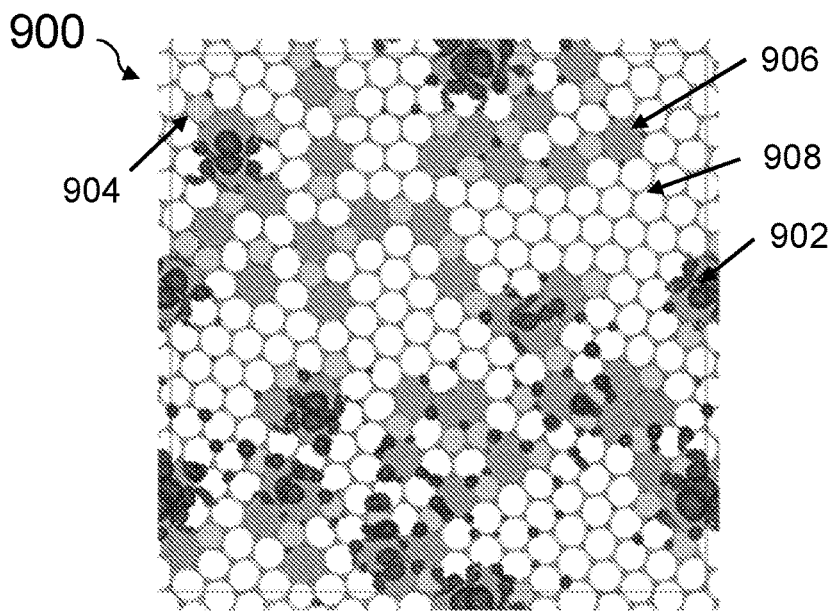
FIG. 9 shows a model used for the theoretical simulation of FIG. 8 overlaid with the modulus squared of the wave functions to show localised electronic distribution in the atomic structure of the MAC.

FIG. 9 shows a model 900 used for the theoretical simulation of FIG. 8. The model 900 is overlaid with the modulus squared of the wave functions to show localised electronic distribution 902 in the atomic structure of the MAC 802.

As shown in the model 900 of FIG. 9, the MAC film is a single-atom thick carbon film having a mixture of hexagonal and non-hexagonal rings in its structure. The rings are fully connected to each other, forming a network of polygons in a large area film whose scale is at least in microns. The ratio of a number of hexagonal rings to a total number of carbon rings (i.e. a total number of hexagonal and non-hexagonal rings) is a measure of crystallinity (or amorphousity), C. Non-hexagons are in a form of 4-, 5-, 7-, 8-, 9-membered rings. A 5-membered ring 904 and a 7-membered ring 906 are shown in FIG. 9, in contrast with the regular 6-membered ring 908 which is typical of crystalline graphene. Disclosed embodiments may support a C value range between and including 0.5 to 0.8. This is different from graphene where C=1 for pure hexagonal network.

Figure 10:
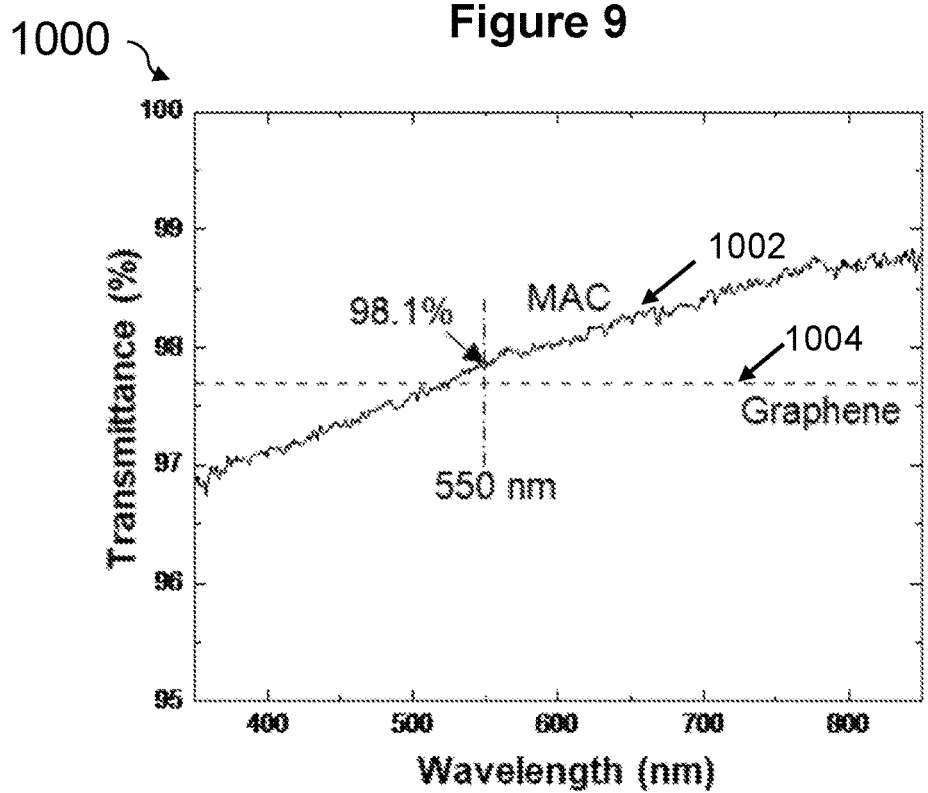
FIG. 10 shows a plot of optical transmission spectrum of the MAC in accordance with an embodiment.

FIG. 10 shows a plot 1000 of optical transmission spectrum of the MAC 1002 in accordance with an embodiment.

The plot 1000 illustrates an optical transparency of the MAC 1002 over a range of light wavelengths. As shown in FIG. 10, the optical transparency is at ~98.1% at a light wavelength of 550 nm, increasing in transparency with increasing light wavelength. Thus, embodiments of the present invention provide a MAC having an optical transparency equal to or greater than 98% at a wavelength of 550 nm or higher. The disclosed MAC differs from graphene. The line 1004 shows a theoretical limit of 97.7% for an optical transparency of graphene. It is therefore evidenced from at least the plot 1000 that the MAC 1002 of present embodiments exhibits higher optical transparency than graphene at a wavelength of about 550 nm or higher. Notably the transparency of the MAC 1002 does not decrease rapidly at short wavelengths (<400 nm). This may partly be due to less contamination in the growth process of the MAC 1002 since the MAC 1002 can be grown on any substrates without using a transfer method. The high optical transparency of the MAC within the visible light range (~98.1% at 550 nm with increasing optical transparency at higher wavelengths) makes MAC an ideal candidate for a seed layer on transparent substrates (e.g. glass or suitable polymers) for forming subsequent active semiconducting films for transparent devices.

Figure 11A:
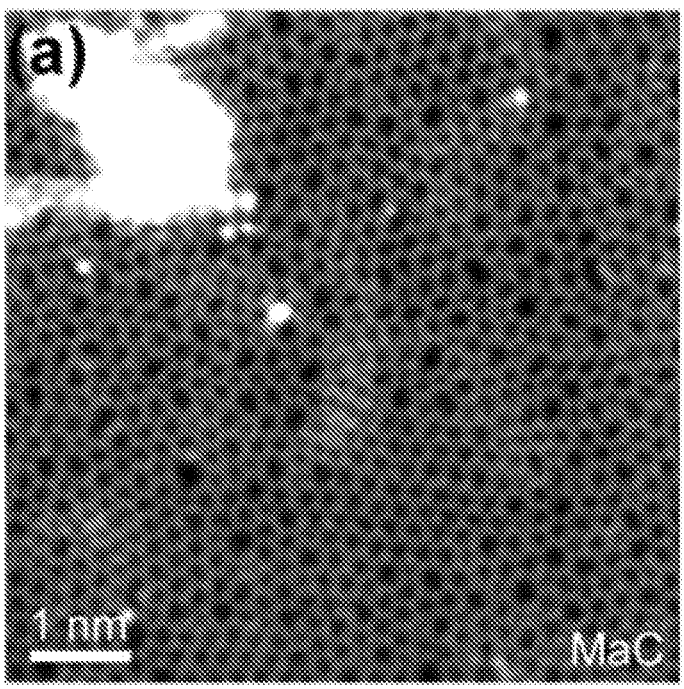
FIGS. 11A and 11B show scanning transmission electron microscopy (STEM) images of a seed layer with two different structural variations in accordance with an embodiment, where
Figure 11B:
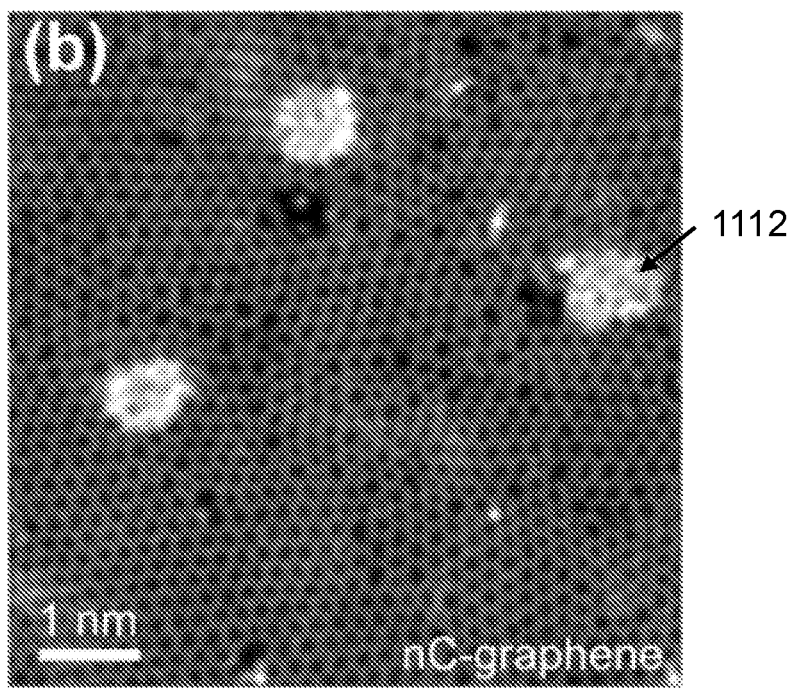

FIGS. 11A and 11B show scanning transmission electron microscopy (STEM) images 1100, 1110 of a seed layer with two different structural variations in accordance with an embodiment, where FIG. 11A shows a STEM image 1100 of a MAC film and FIG. 11B shows a STEM image 1110 of a nanocrystalline graphene film. The "white" clusters 1112 as shown in FIG. 11B are related to contamination absorbed on the surface of the nanocrystalline graphene film and is not related to crystallinity of its atomic structure.

A wide range of atomic structural variation within a carbon-based seed layer is possible, from a completely amorphous layer (e.g. a MAC) to a nanocrystalline sp$^2$-carbon layer (e.g. a nanocrystalline graphene layer) depending on the synthesis conditions. Moreover, the seed layer can also be formed ranging from a monolayer to a multilayer stack on a substrate. Such structural variations can tune the vdW interaction between the seed layer and the layer of material (or the epilayer), and can remotely modulate an interaction between the substrate and the adatoms for forming the layer of material during growth. For example, by tuning the crystallinity of the seed layer from completely amorphous to nanocrystalline, more interaction between the substrate and the adatoms can be achieved because the screening of a crystallinity effect of the substrate is provided by the electric potential wells of the disordered atomic structure of the 2D amorphous seed layer.

An example of tuning the crystallinity of the carbon based seed layer can be done by using similar laser-based growth conditions as described in relation to the step 302, but with the use of e.g. methane precursor gas and a copper foil substrate. For example, for forming the nanocrystalline carbon film as shown in FIG. 11B, the temperature of the copper foil can be set in a range of 500° C. to 600° C., while for forming a fully amorphous film like that shown in FIG. 11A, the temperature of the copper foil can be set at less than 400° C. This is because a higher substrate temperature during growth leads to a more crystalline material.

Figure 12A:
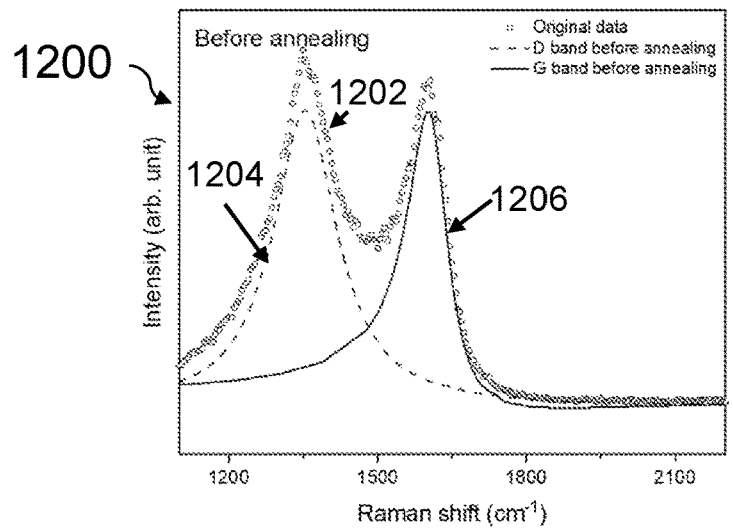
FIGS. 12A and 12B show Raman spectra of a MAC before and after a temperature treatment at about 700° C. in accordance with an embodiment, where
Figure 12B:
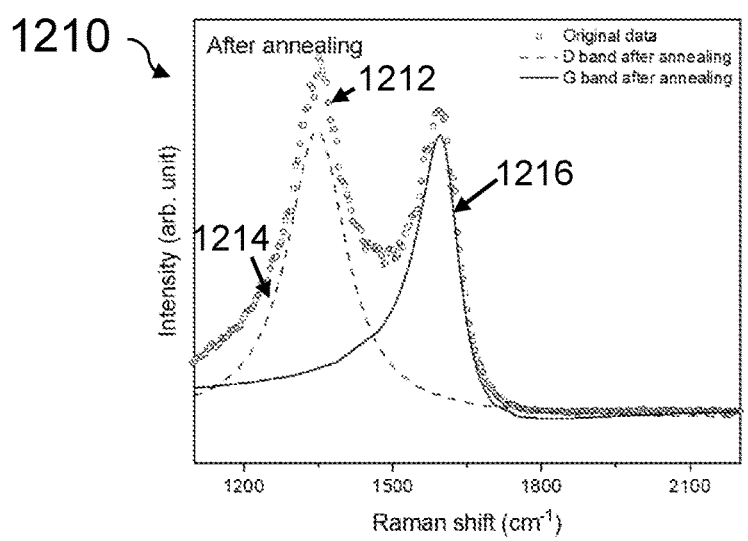

FIGS. 12A and 12B show Raman spectra 1200, 1210 of a MAC before and after a temperature treatment at about 700° C. in accordance with an embodiment, where FIG. 12A shows the Raman spectrum 1200 of the MAC before the temperature treatment and FIG. 12B shows the Raman spectrum 1210 of the MAC after the temperature treatment.

FIG. 12A shows raw data 1202 obtained from Raman spectroscopy of the MAC before the temperature treatment, fitted with a D band 1204 and a G band 1206, while FIG. 12B shows raw data 1212 obtained from Raman spectroscopy of the MAC after the temperature treatment, fitted with a D band 1214 and a G band 1216. As shown in the Raman spectra 1200, 1210, the shapes of the D bands 1204, 1214 and the G bands 1206, 1216 and their D/G ratios are similar. This verifies that there is no observable change in the crystallinity or the grain size of the MAC after undergoing the heat treatment at about 700° C. The MAC is therefore thermally stable at a high temperature of ~700° C., rendering the MAC a stable seed layer for a subsequent high temperature growth of the layer of material. It will be appreciated that since the MAC is thermally stable at a temperature of ~700° C., it is also thermally stable at any temperature that is less than 700° C.

Figure 13:
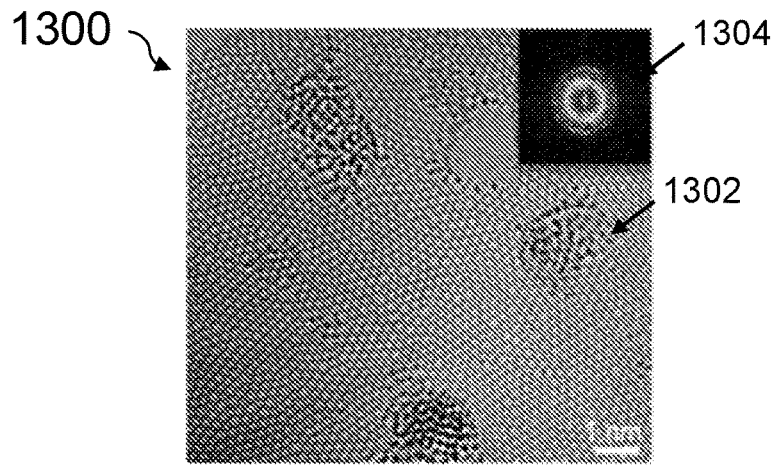
FIG. 13 shows a transmission electron microscopy (TEM) image of the MAC of FIG. 12B after the temperature treatment.

FIG. 13 shows a transmission electron microscopy (TEM) image 1300 of the MAC of FIG. 12B after the temperature treatment. The TEM image 1300 of the MAC has a size of 10×10 nm$^2$, where clusters 1302 as shown in FIG. 13 are contamination that covers some areas of the MAC. The contamination clusters 1302 may be formed due to the transfer process from a substrate (e.g. a copper foil) to the TEM grid for taking this TEM image 1300, and are not related to the crystallinity of the MAC. The inset 1304 of FIG. 13 is the Fourier transform of the TEM image 1300 and shows a diffraction pattern of the TEM image 1300. Particularly, the inset 1304 shows amorphous halo rings, instead of a sharp ring or an individual spot which indicates nanocrystalline graphene or polycrystalline graphene respectively.

In addition to the MAC being a thermally stable layer, the MAC also has a high thermal conductivity which enables it to function as a heat spreading layer in a heterostructure comprising active semiconducting epilayers for transmitting heat to a heat sink. This is advantageous as thermal management is an essential aspect of thin-film devices such as LEDs. The ability of the MAC to spread heat quickly helps to avoid overheating and deterioration of device performances.

Figure 14:
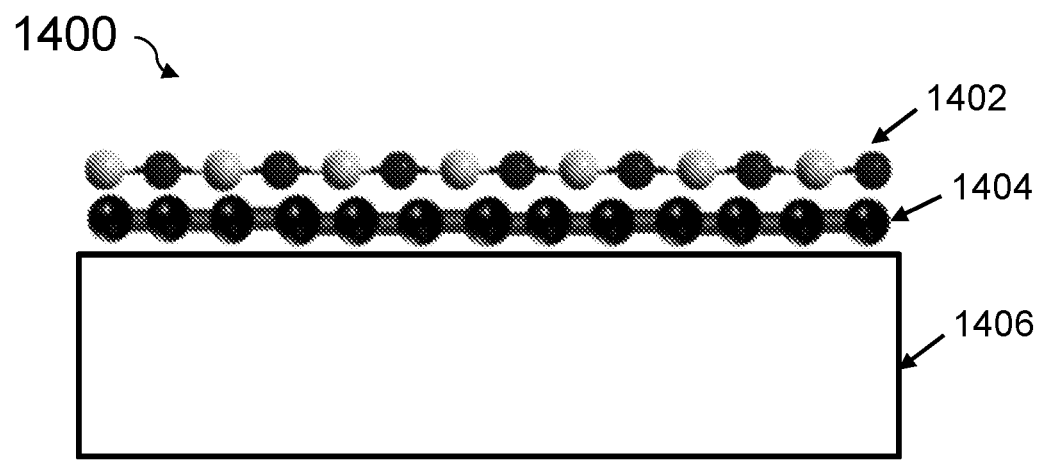
FIG. 14 shows a schematic of a heterostructure comprising a two-dimensional (2D) material grown on the seed layer on a substrate in accordance with an embodiment.

FIG. 14 shows a schematic of a heterostructure 1400 comprising a layer of two-dimensional (2D) material 1402 grown on a seed layer 1404 on a substrate 1406 in accordance with an embodiment. The heterostructure 1400 has a similar structure as the heterostructure 100 as shown in FIG. 1 and can be formed or fabricated using the method 300 of FIG. 3.

The seed layer 1404 comprises a monolayer of amorphous 2D material (e.g. MAC in the present embodiment, but other monolayer 2D amorphous materials can also be used) grown directly on the substrate 1406. The substrate 1406 in the present embodiment comprises $SiO_2$ but other substrates such as Si, SiC, sapphire, a group III-V material, a group II-VI material, oxides etc. can also be used. The seed layer 1404 grown on the substrate 1406 functions to stabilize the subsequent growth of the layer of 2D material 1402 using the strong vdW interaction between adatoms of the 2D material layer 1402 and a surface of the seed layer 1404. This advantageously aids to circumvent the stringent requirements of using specialized substrate for stable growth of the layer of 2D material 1402.

Although FIG. 14 shows a monolayer amorphous carbon (MAC) as the seed layer 1404, multilayers of MAC can also be employed by either a direct growth or a transfer method. The layer of 2D material 1402 grown includes one or more layers of monolayer 2D amorphous film, 2D crystalline film, graphene, black phosphorene, borophene, hexagonal boron nitride (hBN) or boron nitride, transition metal dichalcogenide (TMD), perovskite and/or boron phosphide (BP). The layer of 2D material 1402 can be grown on the seed layer 1404 using deposition techniques such as metal-organic chemical vapour deposition (MOCVD), thermal chemical vapour deposition (TCVD), plasma enhanced chemical vapour deposition (PECVD), atomic layer deposition (ALD). The 2D-2D composite structure (i.e. the free-standing structure comprising the layers 1402, 1404) can be detached from the substrate 1406 after growth to form a freestanding stack which can be further integrated in a fabrication process of thin-film and flexible optoelectronic devices.

Figure 15:
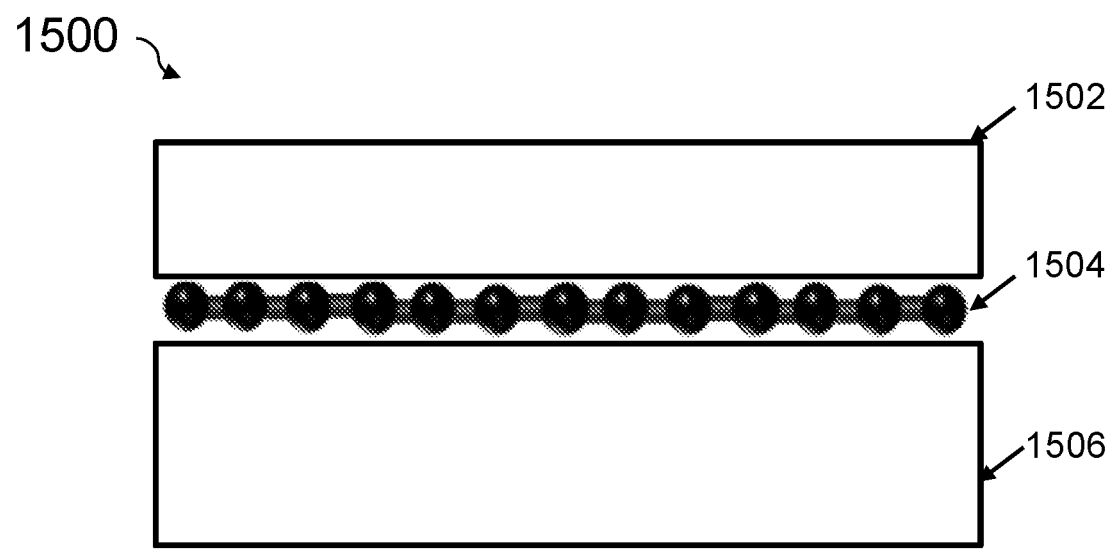
FIG. 15 shows a schematic of a heterostructure comprising a three-dimensional (3D) material grown on the seed layer on a substrate in accordance with an embodiment.

FIG. 15 shows a structure of a heterostructure 1500 comprising a layer of three-dimensional (3D) material 1502 grown on a seed layer 1504 on a substrate 1506 in accordance with an embodiment. The heterostructure 1500 has a similar structure as the heterostructure 100 as shown in FIG. 1 and can be formed or fabricated using the method 300 of FIG. 3. The difference between the heterostructure 1500 and the heterostructure 1400 is that the layer of material 1502 grown on the seed layer 1504 is a layer of 3D material, in contrast to the layer of 2D material 1402 comprised in the heterostructure 1400.

Different embodiments including different types of 3D materials and substrates used are described below.

(i) Integration of CMOS Compatible Substrate (e.g. Si or Ge) with III-V Semiconductors Planar Thin Films In this embodiment, a layer of MAC is formed on a Si or Ge substrate 1506. The MAC functions as a seed layer 1504 for subsequent epitaxial or non-epitaxial growth of one or more layers 1502 of III-V semiconductors (such as GaAs, GaN, AlN, InP, InN etc.) using existing deposition techniques (such as MOCVD, TCVD, PECVD, ALD etc.). The III-V semiconducting materials can be used as active layers for applications such as light emitting diodes (LEDs), infrared (IR) sensors, photodetectors and other optoelectronic devices.

ii) II-VI Semiconductors Thin Films

An ability to integrate II-VI thin film semiconductors (e.g. CdTe, CdS, ZnS etc.) on arbitrary substrates (e.g. Si, semiconducting materials, glass, metal foils, polymers etc.) is advantageous for solar cells, photovoltaics and aerospace applications. As discussed above, achieving a uniform planar layer of material by vdW epitaxy is challenging due to the low wettability on epitaxial surface. In present embodiments, a layer of MAC 1504, which functions as the seed layer 1504, can be formed on the substrate 1506 for epitaxial or non-epitaxial growth of the layer 1502 of 3D planar films of II-VI semiconductors. Examples of 3D group II-VI semiconducting materials films include CdTe, CdS, ZnS etc.

iii) Oxide Thin Films

Oxide thin films including simple metal oxides ($Hf_2O_3$, $Al_2O_3$, MnO etc.) and complex oxides (perovskite, spinel etc.) play a significant role in a variety of electronic, spintronic, magnetoelectric and energy storage devices owing to their functional characteristics. These oxides may function as dielectrics, piezoelectrics, pyroelectrics etc. Using a similar scheme as shown in FIG. 15, one or more layers of oxides 1502 can be deposited using MAC as the seed layer 1504 on the substrate 1506. The substrate 1506 in this application can be any arbitrary substrate such as Si, semiconducting materials, glass, metal foils, polymers etc. The deposited layer of oxide film 1502 can also be exfoliated to obtain freestanding membranes using the method 400 as described in relation to FIGS. 4 and 5.

Figure 16A:
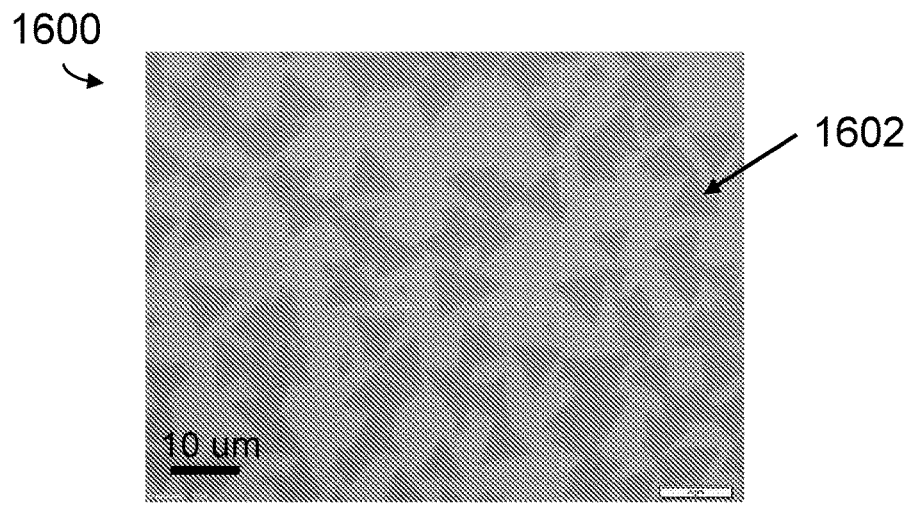
FIGS. 16A, 16B and 16C show optical images of $MoS_2$ grown on three different surfaces in accordance with an embodiment, where
Figure 16B:
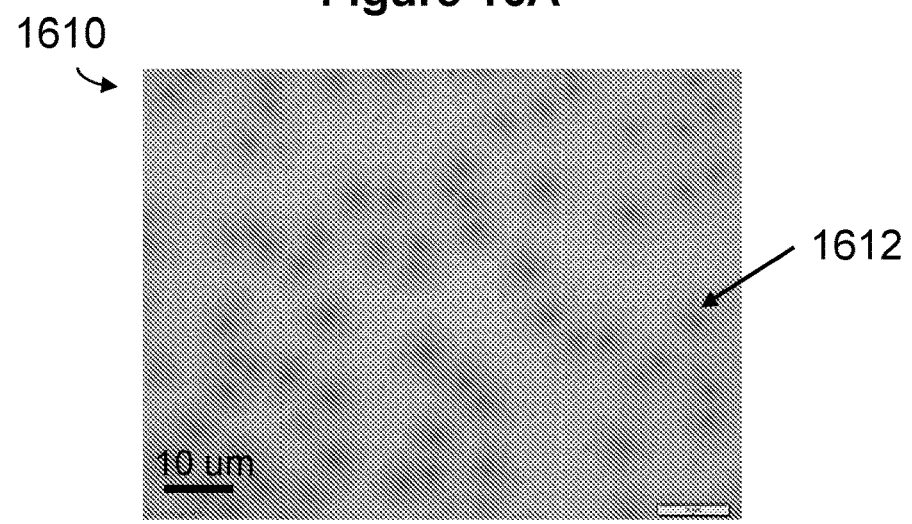
Figure 16C:
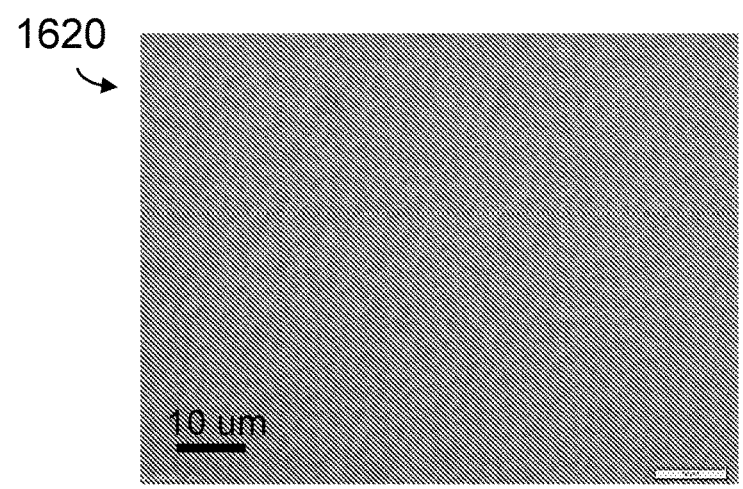

FIGS. 16A, 16B and 16C show optical images 1600, 1610, 1620 of $MoS_2$ grown on three different surfaces in accordance with an embodiment, where FIG. 16A shows the optical image 1600 of $MoS_2$ grown on silicon dioxide ($SiO_2$), FIG. 16B shows the optical image 1610 of $MoS_2$ grown on a single layer of MAC on $SiO_2$, and FIG. 16C shows the optical image 1620 of $MoS_2$ grown on a few layers of MAC on $SiO_2$.

In the present embodiments, the MAC is first grown on the $SiO_2$ substrate using the LCVD method as described in relation to the step 302 of FIG. 3. The growth conditions of the MAC on $SiO_2$ substrate are the same as that described for the sapphire substrate in relation to the step 302, and these are not repeated here for succinctness. The one or more MAC layers acts as a seed layer for the subsequent growth of the $MoS_2$ layer. The layer of $MoS_2$ is a 2D material that was grown by thermal CVD over the one or more MAC layers. The parameters for the thermal CVD growth of the $MoS_2$ layer is as follows: $MoO_3$+S, atmospheric pressure chemical vapour deposition (APCVD), 750° C., 20 sccm Ar and a 10-minute growth time.

As evidenced in FIGS. 16A, 16B and 16C, the layer of $MoS_2$ grows differently on the three different surfaces (i.e. without MAC, a monolayer MAC and a few layers of MAC, respectively). As shown in the optical image 1600 of FIG. 16A, standard $MoS_2$ grown on $SiO_2$ forms triangular crystals 1602. The optical image 1610 of FIG. 16B shows that using a single MAC layer as the seed layer results in the growth of $MoS_2$ crystals 1612 having irregular shapes and multi-layer centres. As shown in the optical image 1620 of FIG. 16C, using a few layers of MAC as the seed layer results in a high density nucleation of $MoS_2$ crystals.

Figure 17A:
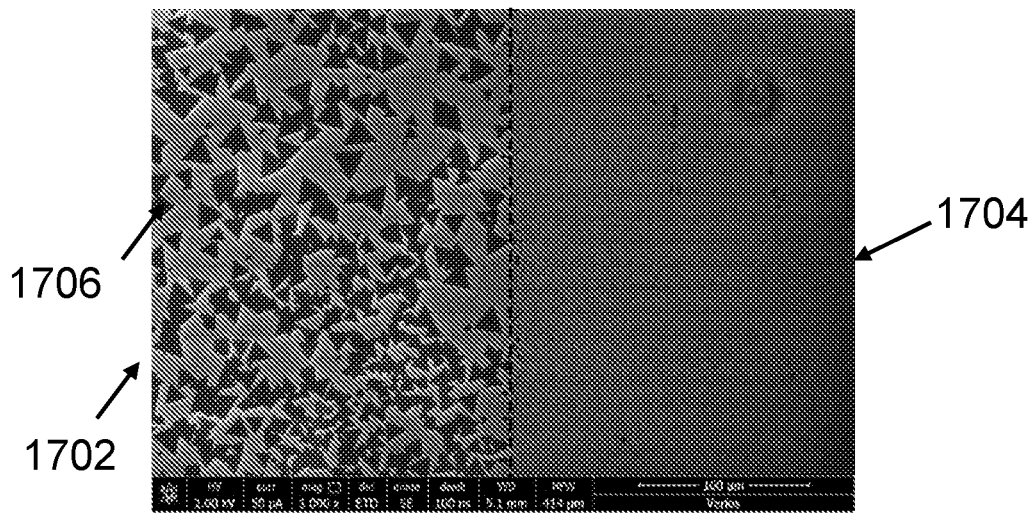
FIGS. 17A and 17B show scanning electron microscopy (SEM) images of $MoS_2$ grown using a sapphire substrate in accordance with an embodiment, where
Figure 17B:
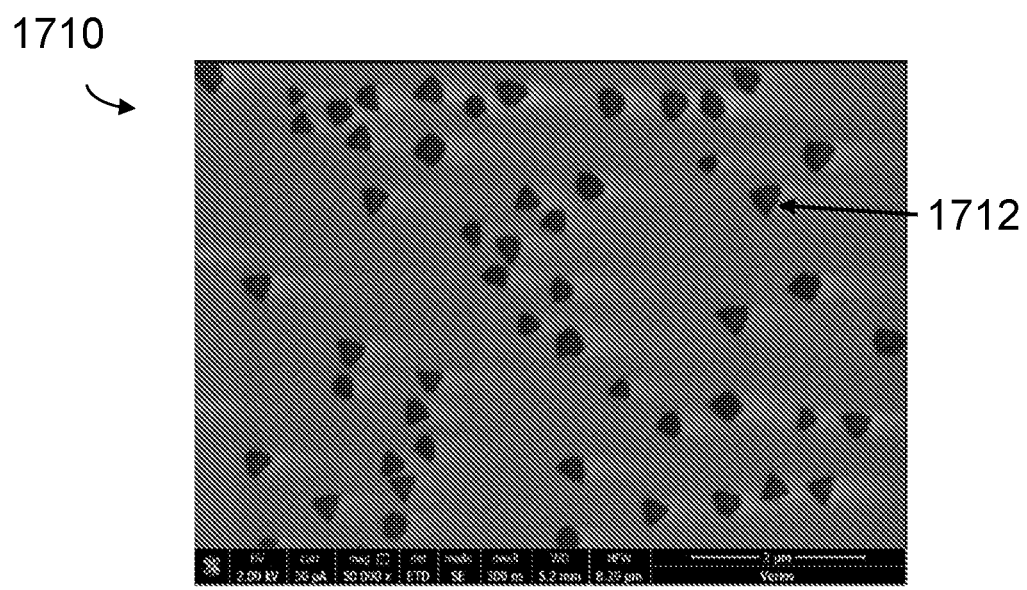
Figure 18A:
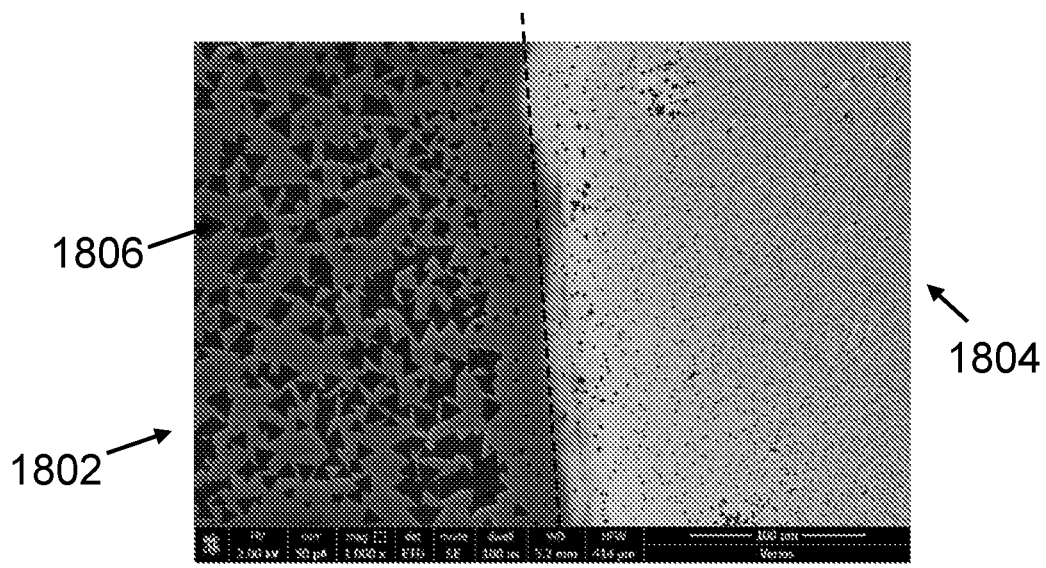
FIGS. 18A and 18B show scanning electron microscopy (SEM) images of $MoS_2$ grown using a sapphire substrate in accordance with an embodiment, where
Figure 18B:
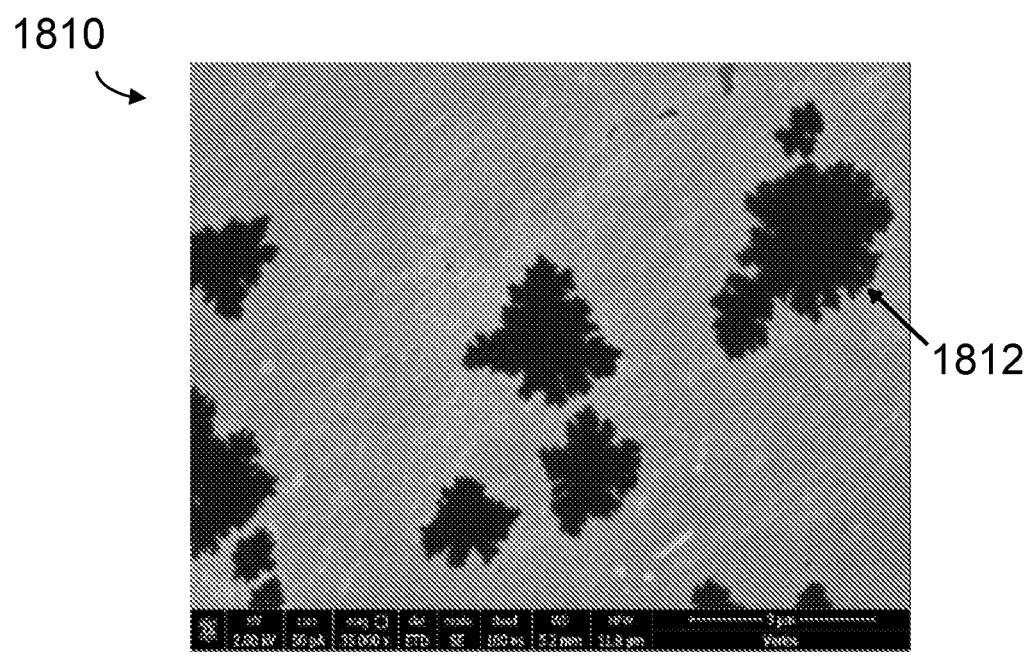

FIGS. 17A and 17B show scanning electron microscopy (SEM) images 1702, 1704, 1710 of $MoS_2$ grown using a sapphire substrate in accordance with an embodiment, where FIG. 17A shows SEM images 1702, 1704 of $MoS_2$ grown directly on the sapphire substrate and on a monolayer of MAC on the sapphire substrate respectively, and FIG. 17B shows a zoom-in SEM image 1710 of the $MoS_2$ grown on the monolayer of MAC on the sapphire substrate. FIGS. 18A and 18B show scanning electron microscopy (SEM) images 1802, 1804, 1810 of $MoS_2$ grown using a sapphire substrate in accordance with an embodiment, where FIG. 18A shows SEM images 1802, 1804 of $MoS_2$ grown directly on the sapphire substrate and on a few layers of MAC on the sapphire substrate respectively, and FIG. 18B shows a zoom-in SEM image 1810 of the $MoS_2$ grown on the few layers of MAC on the sapphire substrate.

In the present embodiments, the MAC is first grown on the sapphire substrate using the LCVD method as described in relation to the step 302 of FIG. 3. The one or more MAC layers acts as a seed layer for the subsequent growth of the $MoS_2$ layer. The growth conditions of the MAC on the sapphire substrate have been previously described in relation to the step 302, and these are not repeated here for succinctness. The layer of $MoS_2$ is a 2D material that was grown by thermal CVD over the one or more MAC layers. The parameters for the thermal CVD growth of the $MoS_2$ layer is as follows: $MoO_3$+S, atmospheric pressure chemical vapour deposition (APCVD), 850° C., 20 sccm Ar, 5 minute of growth time.

As evidenced in FIGS. 17A, 17B, 18A and 18B, the layer of $MoS_2$ grows differently on the three different surfaces (i.e. without MAC, a monolayer MAC and a few layers of MAC, respectively). As shown in the SEM images 1702 and 1802 of FIGS. 17A and 18A respectively, standard $MoS_2$ grown on sapphire forms triangular crystals 1706, 1806. The SEM image 1710 of FIG. 17B shows that using a single MAC layer as the seed layer results in a high density nucleation of $MoS_2$ crystals with triangular shape 1712. As shown in the SEM image 1810 of FIG. 18B, using a few layers of MAC as the seed layer results in a high density nucleation of $MoS_2$ crystals with dendritic shapes 1812.

Figure 19:
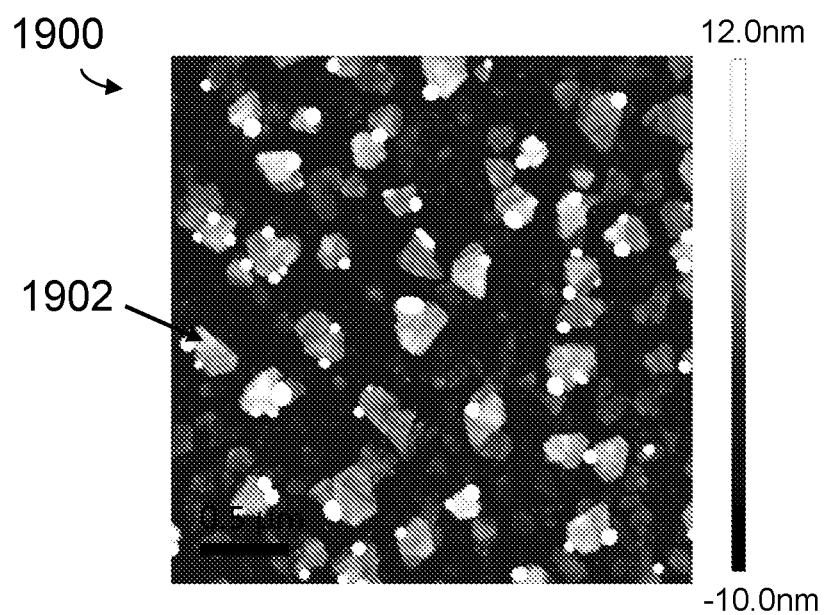
FIG. 19 shows an atomic force microscopy (AFM) image of $In_2Se_3$ grown on a monolayer of MAC on a $SiO_2$ substrate in accordance with an embodiment.

FIG. 19 shows an atomic force microscopy (AFM) image 1900 of indium selenide ($In_2Se_3$) grown on a monolayer of MAC on a $SiO_2$ substrate in accordance with an embodiment.

The MAC is first grown or transferred on the $SiO_2$ substrate, where the MAC functions as a seed layer for subsequent growth of $In_2Se_3$. $In_2Se_3$ is a 2D material which is subsequently grown on the MAC using a molecular beam epitaxy (MBE) technique. In the present embodiment, $In_2Se_3$ was grown in a MBE chamber with a base pressure~$6\times10^{-10}$ Torr. Ultrapure $In_2Se_3$ powder (99.99%) was evaporated from a crucible heated by an electron beam source with the temperature maintained at 150° C. The chamber pressure during growth was ~$6\times10^{-9}$ Torr.

The layer of $In_2Se_3$ grows differently when using a single layer of MAC as a seed layer as compared to growing the layer of $In_2Se_3$ on graphene or directly on the $SiO_2$ substrate without the MAC. As shown in the AFM image 1900, the $In_2Se_3$ crystals 1902 formed using a single layer of MAC as the seed layer retain the triangular facets with a thickness ranging from a few Å (i.e. a thickness of a monolayer) to about 7 nm thick. On the other hand, if $In_2Se_3$ is grown on a layer of graphene on $SiO_2$ substrate, the $In_2Se_3$ crystals as grown will be of a monolayer thickness with triangular shapes. If $In_2Se_3$ is grown directly on the $SiO_2$ substrate, the $In_2Se_3$ crystals as grown have a highly disordered bulk (3D) structure.

Alternative embodiments of the invention include: (i) the seed layer 102 comprises one or more layers of 2D amorphous material selected from one or more of: amorphous $MoS_2$, amorphous $In_2Se_3$, amorphous transition metal dichalcogenides, amorphous black phosphorene, amorphous borophene, amorphous boron nitride; (ii) the substrate 104 selected from one of: Si, SiC, sapphire, a group III-V material, a group II-VI material, oxides semiconducting materials, glass, metals and polymers; (iii) the layer of material 106 selected from a 2D material or a 3D material, and examples of a 2D material and a 3D material are provided in relation to FIGS. 14 and 15; and (iv) the layer of material 106 can be formed by various deposition techniques such as LPCVD, APCVD, MOCVD, TCVD, PECVD, MBE and ALD.

Although only certain embodiments of the present invention have been described in detail, many variations are possible in accordance with the appended claims. For example, features described in relation to one embodiment may be incorporated into one or more other embodiments and vice versa.

The invention claimed is:

1. A seed layer for inducing nucleation to form a layer of material on a substrate, the seed layer comprising a layer of two-dimensional (2D) monolayer amorphous material having a disordered atomic structure, the disordered atomic structure generating a strained 2D lattice of the layer of 2D monolayer amorphous material and resulting in an atomic rearrangement of the layer of 2D monolayer amorphous material in three-dimensional (3D) space to create localised electronic states to form electric potential wells for bonding adatoms to a surface of the seed layer via van der Waals (vdW) interaction, wherein the layer of 2D monolayer amorphous material comprises a homogenous 2D monolayer amorphous carbon, and wherein the seed layer further comprises one or more additional layers of 2D monolayer amorphous carbon deposited directly on the layer of 2D monolayer amorphous material to form a multilayer structure of the seed layer to tune the vdW interaction between the seed layer and the layer of material and to remotely modulate an interaction between the substrate and the adatoms for forming the layer of material during growth.

2. The seed layer of claim 1, wherein the seed layer has an optical transparency of more than 98% at a light wavelength between 550 nm to 800 nm.

3. The seed layer of claim 1, wherein the seed layer is thermally stable at a temperature of 700° C.

4. A heterostructure comprising:
a substrate; and
a seed layer formed on the substrate, the seed layer being adapted to induce nucleation to form a layer of material on the substrate and comprises a layer of two-dimensional (2D) monolayer amorphous material having a disordered atomic structure, the disordered atomic structure generating a strained 2D lattice of the layer of 2D monolayer amorphous material and resulting in an atomic rearrangement of the layer of 2D monolayer amorphous material in three-dimensional (3D) space to create localised electronic states to form electric potential wells for bonding adatoms to a surface of the seed layer via van der Waals (vdW) interaction, wherein the layer of 2D monolayer amorphous material comprises a homogenous 2D monolayer amorphous carbon, and wherein the seed layer further comprises one or more additional layers of 2D monolayer amorphous carbon deposited directly on the layer of 2D monolayer amorphous material to form a multilayer structure of the seed layer to tune the vdW interaction between the seed layer and the layer of material and to remotely modulate an interaction between the substrate and the adatoms for forming the layer of material during growth.

5. The heterostructure of claim 4, wherein the substrate comprises one of: a metal, a semiconductor, an insulator, glass, a polymer, silicon, silicon carbide, sapphire, a group III-V substrate, a group II-VI substrate or an oxide.

6. The heterostructure of claim 4, wherein the substrate is a crystalline substrate, the seed layer is adapted to screen effects provided by a crystallinity of the crystalline substrate.

7. The heterostructure of claim 4, further comprising the layer of material formed on the seed layer, the layer of material being formed by bonding the adatoms to the surface of the seed layer via the van der Waals (vdW) interaction.

8. The heterostructure of claim 7, wherein the layer of material comprises one or more layers of a 2D material, the 2D material comprises one of: graphene, borophene, boron nitride, a perovskite, a transition metal dichalcogenide or a black phosphorene.

9. The heterostructure of claim 7, wherein the layer of material comprises one or more layers of a group III-V semiconducting material, or the layer of material comprises one or more layers of a group II-VI semiconducting material, or the layer of material comprises one or more layers of an oxide.

10. The heterostructure of claim 9, wherein the group III-V semiconducting material comprises one of: GaAs, GaN, AlN, InP and InN.

11. The heterostructure of claim 9, wherein the group II-VI semiconducting material comprises one of: CdTe, CdS and ZnS.

12. The heterostructure of claim 9, wherein the oxide comprises one of: hafnium oxide, aluminium oxide, manganese oxide, perovskite or spinel.

13. A device comprising the heterostructure of claim 4.

14. A method of forming a layer of material on a substrate, the method comprising:
    forming a seed layer on the substrate, the seed layer comprising a layer of two-dimensional (2D) monolayer amorphous material having a disordered atomic structure, the disordered atomic structure generating a strained 2D lattice of the layer of 2D monolayer amorphous material and resulting in an atomic rearrangement of the layer of 2D monolayer amorphous material in three-dimensional (3D) space to create localised electronic states to form electric potential wells for bonding adatoms to a surface of the seed layer via van der Waals (vdW) interaction, wherein the layer of 2D monolayer amorphous material comprises a homogenous 2D monolayer amorphous carbon, and wherein the seed layer further comprises one or more additional layers of 2D monolayer amorphous carbon deposited directly on the layer of 2D monolayer amorphous material to form a multilayer structure of the seed layer to tune the vdW interaction between the seed layer and the layer of material and to remotely modulate an interaction between the substrate and the adatoms for forming the layer of material during growth; and forming the layer of material on the seed layer by bonding the adatoms to the surface of the seed layer via the van der Waals (vdW) interaction.

15. The method of claim 14, further comprising varying the disordered atomic structure of the layer of 2D monolayer amorphous material to modulate a strength of the vdW interaction between the adatoms and the surface of the seed layer.

16. The method of claim 14, further comprising:
    forming a handling layer on the layer of material; and
    detaching the seed layer from the substrate to form a free-standing film comprising the seed layer and the layer of material.

17. The method of claim 14, wherein forming the seed layer on the substrate comprises growing the seed layer on the substrate using laser-assisted chemical vapour deposition (LCVD).

18. The method of claim 17, wherein the LCVD is performed at a temperature between 20° C. and 400° C.

19. The seed layer of claim 1, wherein the disordered atomic structure of the layer of 2D monolayer amorphous material is varied to modulate a strength of the vdW interaction between the adatoms and the surface of the seed layer.

20. The seed layer of claim 1, wherein a number of layers of 2D monolayer amorphous carbon is controlled to tune the vdW interaction between the seed layer and the layer of material and to remotely modulate an interaction between the substrate and the adatoms for forming the layer of material during growth.

* * * * *